(12) United States Patent
Tsai

(10) Patent No.: US 8,842,473 B2
(45) Date of Patent: Sep. 23, 2014

(54) TECHNIQUES FOR ACCESSING COLUMN SELECTING SHIFT REGISTER WITH SKIPPED ENTRIES IN NON-VOLATILE MEMORIES

(75) Inventor: Wanfang Tsai, Mountain View, CA (US)

(73) Assignee: SanDisk Technologies Inc., Plano, TX (US)

( * ) Notice: Subject to any disclaimer, the term of this patent is extended or adjusted under 35 U.S.C. 154(b) by 371 days.

(21) Appl. No.: 13/420,961

(22) Filed: Mar. 15, 2012

(65) Prior Publication Data

US 2013/0242655 A1   Sep. 19, 2013

(51) Int. Cl.
*G11C 7/02* (2006.01)
*G11C 16/06* (2006.01)

(52) U.S. Cl.
CPC ...................................... *G11C 16/06* (2013.01)
USPC .................................................... 365/185.09

(58) Field of Classification Search
CPC ....................................................... G11C 16/06
USPC ........................................ 365/185.01–185.33
See application file for complete search history.

(56) References Cited

U.S. PATENT DOCUMENTS

| | | |
|---|---|---|
| 3,710,348 A | 1/1973 | Craft |
| 3,895,360 A | 7/1975 | Cricchi et al. |
| 4,034,356 A | 7/1977 | Howley et al. |
| 4,266,271 A | 5/1981 | Chamoff et al. |
| 4,314,334 A | 2/1982 | Daughton et al. |
| 4,357,685 A | 11/1982 | Daniele et al. |
| 4,402,067 A | 8/1983 | Moss et al. |
| 4,426,688 A | 1/1984 | Moxley |
| 4,720,815 A | 1/1988 | Ogawa |
| 4,757,477 A | 7/1988 | Nagayama et al. |
| 4,800,530 A | 1/1989 | Itoh et al. |
| 4,802,136 A | 1/1989 | Nose et al. |
| 4,835,549 A | 5/1989 | Samejima et al. |
| 4,852,062 A | 7/1989 | Baker et al. |

(Continued)

FOREIGN PATENT DOCUMENTS

| | | |
|---|---|---|
| CN | 1549133 | 11/2004 |
| CN | 1568522 A | 1/2005 |

(Continued)

OTHER PUBLICATIONS

Notification of Transmittal of the International Search Report and the Written Opinion of the International Searching Authority, or the Declaration for Int'l Appl. No. PCT/US2013/026838 mailed Jul. 11, 2013, 9 pages.

(Continued)

*Primary Examiner* — Harry W Byrne
(74) *Attorney, Agent, or Firm* — Davis Wright Tremaine LLP

(57) ABSTRACT

Techniques are present for locating an initial physical location in a looping shift register with random skips on each loop. Here the shift register is for accessing columns in a non-volatile memory, where defective columns of the array are skipped. A look-up table provides for the initial skip of each loop, providing the number of skips from preceding loop to provide a physical address is close to the actual physical address. A new structure of shift registers then enables an automatic shift mode within the loop. The new structure has an additional register and logic gates that count how many skipped entry before the current pointer and shift the current pointer accordingly.

15 Claims, 17 Drawing Sheets

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,168,463 A | 12/1992 | Ikeda et al. |
| 5,172,338 A | 12/1992 | Mehrotra et al. |
| 5,200,959 A | 4/1993 | Gross et al. |
| 5,270,979 A | 12/1993 | Harari et al. |
| 5,297,029 A | 3/1994 | Nakai et al. |
| 5,307,232 A | 4/1994 | Manske |
| 5,313,421 A | 5/1994 | Guterman et al. |
| 5,315,541 A | 5/1994 | Harari et al. |
| 5,343,063 A | 8/1994 | Yuan et al. |
| 5,359,571 A | 10/1994 | Yu |
| 5,369,618 A | 11/1994 | Takasugi |
| 5,380,672 A | 1/1995 | Yuan et al. |
| 5,386,390 A | 1/1995 | Okitaka |
| 5,418,752 A | 5/1995 | Harari et al. |
| 5,422,842 A | 6/1995 | Cernea et al. |
| 5,428,621 A | 6/1995 | Mehrotra et al. |
| 5,430,679 A | 7/1995 | Hiltebeitel et al. |
| 5,430,859 A | 7/1995 | Norman et al. |
| 5,432,741 A | 7/1995 | Devore et al. |
| 5,442,748 A | 8/1995 | Chang et al. |
| 5,479,370 A | 12/1995 | Furuyama et al. |
| 5,485,425 A | 1/1996 | Iwai et al. |
| 5,570,315 A | 10/1996 | Tanaka et al. |
| 5,595,924 A | 1/1997 | Yuan et al. |
| 5,602,987 A | 2/1997 | Harari et al. |
| 5,606,584 A | 2/1997 | Beat |
| 5,642,312 A | 6/1997 | Harari |
| 5,657,332 A | 8/1997 | Auclair et al. |
| 5,661,053 A | 8/1997 | Yuan |
| 5,663,901 A | 9/1997 | Wallace et al. |
| 5,712,180 A | 1/1998 | Guterman et al. |
| 5,726,947 A | 3/1998 | Yamazaki et al. |
| 5,768,192 A | 6/1998 | Eitan |
| 5,774,397 A | 6/1998 | Endoh et al. |
| 5,783,958 A | 7/1998 | Lysinger |
| 5,815,444 A | 9/1998 | Ohta |
| 5,822,245 A | 10/1998 | Gupta et al. |
| 5,835,406 A | 11/1998 | Chevallier et al. |
| 5,848,009 A | 12/1998 | Lee et al. |
| 5,862,080 A | 1/1999 | Harari et al. |
| 5,890,192 A | 3/1999 | Lee et al. |
| 5,903,495 A | 5/1999 | Takeuchi et al. |
| 5,930,167 A | 7/1999 | Lee |
| 5,936,971 A | 8/1999 | Harari et al. |
| 5,940,329 A | 8/1999 | Seitsinger et al. |
| 5,946,253 A | 8/1999 | Fujiwara |
| 6,011,725 A | 1/2000 | Eitan |
| 6,021,463 A | 2/2000 | Belser |
| 6,028,472 A | 2/2000 | Nagumo |
| 6,034,891 A | 3/2000 | Norman |
| 6,034,910 A | 3/2000 | Iwase |
| 6,038,167 A | 3/2000 | Miwa et al. |
| 6,038,184 A | 3/2000 | Naritake |
| 6,046,935 A | 4/2000 | Takeuchi et al. |
| 6,091,666 A | 7/2000 | Arase et al. |
| 6,151,248 A | 11/2000 | Harari et al. |
| 6,172,917 B1 | 1/2001 | Kataoka et al. |
| 6,222,757 B1 | 4/2001 | Rau et al. |
| 6,222,762 B1 | 4/2001 | Guterman et al. |
| 6,230,233 B1 | 5/2001 | Lofgren et al. |
| 6,252,800 B1 | 6/2001 | Chida |
| 6,256,230 B1 | 7/2001 | Miwa et al. |
| 6,256,252 B1 | 7/2001 | Arimoto |
| 6,266,273 B1 | 7/2001 | Conley et al. |
| 6,282,624 B1 | 8/2001 | Kimura et al. |
| 6,327,206 B2 | 12/2001 | Kubota et al. |
| 6,353,553 B1 | 3/2002 | Tamada et al. |
| 6,373,746 B1 | 4/2002 | Takeuchi et al. |
| 6,385,075 B1 | 5/2002 | Taussig et al. |
| 6,396,736 B1 | 5/2002 | Jyouno et al. |
| 6,426,893 B1 | 7/2002 | Conley et al. |
| 6,456,528 B1 | 9/2002 | Chen |
| 6,469,945 B2 | 10/2002 | Patti et al. |
| 6,480,423 B2 | 11/2002 | Toda et al. |
| 6,496,431 B1 | 12/2002 | Nakahara et al. |
| 6,496,971 B1 | 12/2002 | Lesea et al. |
| 6,510,488 B2 | 1/2003 | Lasser |
| 6,512,263 B1 | 1/2003 | Yuan et al. |
| 6,522,580 B2 | 2/2003 | Chen et al. |
| 6,523,132 B1 | 2/2003 | Harari et al. |
| 6,560,146 B2 | 5/2003 | Cernea |
| 6,581,142 B1 | 6/2003 | Jacobs |
| 6,594,177 B2 | 7/2003 | Matarrese et al. |
| 6,603,683 B2 | 8/2003 | Hsu et al. |
| 6,609,209 B1 | 8/2003 | Tiwari et al. |
| 6,609,236 B2 | 8/2003 | Watanabe et al. |
| 6,657,891 B1 | 12/2003 | Shibata et al. |
| 6,717,858 B2 | 4/2004 | Kawai et al. |
| 6,771,536 B2 | 8/2004 | Li et al. |
| 6,781,877 B2 | 8/2004 | Cernea et al. |
| 6,795,837 B1 | 9/2004 | Wells |
| 6,813,184 B2 | 11/2004 | Lee |
| 6,822,911 B2 | 11/2004 | Cernea |
| 6,842,160 B2 | 1/2005 | Yamazaki et al. |
| 6,853,596 B2 | 2/2005 | Cheung |
| 6,862,217 B2 | 3/2005 | Kawabata |
| 6,870,768 B2 | 3/2005 | Cernea et al. |
| 6,891,753 B2 | 5/2005 | Cernea |
| 6,975,536 B2 | 12/2005 | Maayan et al. |
| 6,983,428 B2 | 1/2006 | Cernea |
| 6,985,388 B2 | 1/2006 | Cernea |
| 6,990,018 B2 | 1/2006 | Tanaka et al. |
| 7,023,736 B2 | 4/2006 | Cernea et al. |
| 7,027,330 B2 | 4/2006 | Park |
| 7,039,781 B2 | 5/2006 | Iwata et al. |
| 7,057,339 B2 | 6/2006 | Boroson et al. |
| 7,058,818 B2 | 6/2006 | Dariel |
| 7,076,611 B2 | 7/2006 | Steere et al. |
| 7,085,159 B2 | 8/2006 | Cernea |
| 7,110,294 B2 | 9/2006 | Kawai |
| 7,158,421 B2 | 1/2007 | Li et al. |
| 7,170,802 B2 | 1/2007 | Cernea et al. |
| 7,206,230 B2 | 4/2007 | Li et al. |
| 7,224,605 B1 | 5/2007 | Moogat |
| 7,299,314 B2 | 11/2007 | Lin et al. |
| 7,310,347 B2 | 12/2007 | Lasser |
| 7,345,928 B2 | 3/2008 | Li |
| 7,405,985 B2 | 7/2008 | Cernea et al. |
| 7,420,847 B2 | 9/2008 | Li |
| 7,426,623 B2 | 9/2008 | Lasser |
| 7,447,070 B2 | 11/2008 | Cernea |
| 7,490,283 B2 | 2/2009 | Gorobets et al. |
| 7,493,457 B2 | 2/2009 | Murin |
| 7,502,254 B2 | 3/2009 | Murin et al. |
| 7,502,259 B2 | 3/2009 | Gorobets |
| 2001/0000023 A1 | 3/2001 | Kawahara et al. |
| 2001/0024397 A1 | 9/2001 | Kubota et al. |
| 2001/0052062 A1 | 12/2001 | Lipovski |
| 2003/0016182 A1 | 1/2003 | Lohr |
| 2003/0161182 A1 | 8/2003 | Li et al. |
| 2003/0182317 A1 | 9/2003 | Kahn et al. |
| 2003/0223274 A1 | 12/2003 | Cernea |
| 2004/0057283 A1 | 3/2004 | Cernea |
| 2004/0057288 A1 | 3/2004 | Kawabata |
| 2004/0060031 A1 | 3/2004 | Cernea |
| 2004/0109357 A1 | 6/2004 | Cernea et al. |
| 2005/0141387 A1 | 6/2005 | Cernea et al. |
| 2005/0144365 A1 | 6/2005 | Gorobets et al. |
| 2005/0213393 A1 | 9/2005 | Lasser |
| 2006/0126390 A1 | 6/2006 | Gorobets |
| 2006/0136656 A1 | 6/2006 | Conley et al. |
| 2007/0061502 A1 | 3/2007 | Lasser |
| 2007/0065119 A1 | 3/2007 | Pomerantz |
| 2007/0091677 A1 | 4/2007 | Lasser et al. |
| 2007/0103978 A1 | 5/2007 | Conley et al. |
| 2007/0159652 A1 | 7/2007 | Sato |
| 2007/0180346 A1 | 8/2007 | Murin |
| 2007/0211530 A1 | 9/2007 | Nakano |
| 2007/0220197 A1 | 9/2007 | Lasser |
| 2007/0220935 A1* | 9/2007 | Cernea ............... 70/370 |
| 2007/0223291 A1* | 9/2007 | Cernea ............. 365/200 |
| 2007/0223292 A1* | 9/2007 | Moogat et al. ..... 365/200 |

(56) References Cited

U.S. PATENT DOCUMENTS

| | | |
|---|---|---|
| 2007/0237006 A1 | 10/2007 | Murin et al. |
| 2007/0260808 A1 | 11/2007 | Raines et al. |
| 2007/0268745 A1 | 11/2007 | Lasser |
| 2007/0283081 A1 | 12/2007 | Lasser |
| 2007/0285980 A1 | 12/2007 | Shimuzu et al. |
| 2008/0104312 A1 | 5/2008 | Lasser |
| 2008/0137419 A1* | 6/2008 | Cernea .................. 365/185.09 |
| 2008/0147996 A1 | 6/2008 | Jenkins et al. |
| 2008/0159012 A1 | 7/2008 | Kim |
| 2008/0181000 A1 | 7/2008 | Lasser |
| 2008/0209112 A1 | 8/2008 | Yu et al. |
| 2008/0244338 A1 | 10/2008 | Mokhlesi et al. |
| 2008/0244367 A1 | 10/2008 | Chin et al. |
| 2008/0250220 A1 | 10/2008 | Ito |
| 2008/0250300 A1 | 10/2008 | Mokhlesi et al. |
| 2008/0266957 A1* | 10/2008 | Moogat et al. .......... 365/185.09 |
| 2008/0301532 A1 | 12/2008 | Uchikawa et al. |
| 2009/0067244 A1 | 3/2009 | Li et al. |
| 2009/0089481 A1 | 4/2009 | Kapoor et al. |
| 2009/0089520 A1 | 4/2009 | Saha et al. |
| 2009/0094482 A1 | 4/2009 | Zilberman |
| 2009/0172498 A1 | 7/2009 | Schlick et al. |
| 2009/0273986 A1* | 11/2009 | Cernea .................. 365/189.05 |
| 2010/0107004 A1 | 4/2010 | Bottelli et al. |
| 2010/0157641 A1 | 6/2010 | Shalvi et al. |
| 2010/0172179 A1 | 7/2010 | Gorobets et al. |
| 2010/0172180 A1 | 7/2010 | Paley et al. |
| 2010/0174845 A1 | 7/2010 | Gorobets et al. |
| 2010/0174846 A1 | 7/2010 | Paley et al. |
| 2010/0174847 A1 | 7/2010 | Paley et al. |
| 2010/0329007 A1 | 12/2010 | Chibvongodze et al. |
| 2011/0063909 A1 | 3/2011 | Komatsu |
| 2011/0099460 A1 | 4/2011 | Dusija et al. |
| 2011/0157987 A1* | 6/2011 | Cernea .................. 365/185.09 |

FOREIGN PATENT DOCUMENTS

| | | |
|---|---|---|
| EP | 00851424 | 7/1998 |
| EP | 1 681 680 A2 | 7/2006 |
| JP | 61292747 A | 12/1986 |
| JP | 62-287497 A | 12/1987 |
| JP | 01128297 | 5/1989 |
| JP | 3156966 | 7/1991 |
| JP | 06150666 A | 5/1994 |
| JP | H11-162183 | 6/1999 |
| JP | 10172292 | 6/2008 |
| WO | WO 92/22068 | 12/1992 |
| WO | WO 98/44420 | 10/1998 |
| WO | WO 00/49488 | 8/2000 |
| WO | WO 03/025939 A2 | 3/2003 |
| WO | WO 2005/066975 A1 | 7/2005 |
| WO | WO 2006/064318 | 6/2006 |
| WO | WO 2007/141783 | 12/2007 |

OTHER PUBLICATIONS

"Numonyx Sector-Based Compact File System (SCFS) Software is a Feature-Rich Flash Solution," *Numonyx*, 2009, 2 pages.

"SanDisk, Toshiba Develop 32-Nanometer NAND Flash Technology," *SanDisk Corporation and Toshiba Corporation*, Feb. 11, 2009, www.physorg.com/news153597019.html, 9 pages.

Choudhuri et al., "Performance Improvement of Block Based NAND Flash Translation Layer," Codes + ISSS '07, Salzburg, Austria, pp. 257-262.

Eitan et al., "NROM: A Novel Localized Trapping, 2-Bit Nonvolatile Memory Cell," *IEEE Electron Device Letters*, vol. 21, No. 11, Nov. 2000, pp. 543-545.

U. Tietze—CH. Schenk, "Halbleiterschaltungstechnik," 1974, Springer-Verlag, Berlin; XP002267743; paragraph 18.6.2 (Translation).

U.S. Appl. No. 11/026,536 entitled "Non-Volatile Memory and Method with Shared Processing for an Aggregate of Read/Write Circuits," filed Dec. 29, 2004, 50 pages.

U.S. Appl. No. 12/051,462 entitled "Adaptive Algorithm in Cache Operation with Dynamic Data Latch Requirements," filed Mar. 19, 2008, 20 pages.

U.S. Appl. No. 12/051,492 entitled "Different Combinations of Wordline Order and Look-Ahead Read to Improve Flash Memory Performance," filed Mar. 19, 2008, 20 pages.

U.S. Appl. No. 12/348,819 entitled "Wear Leveling for Non-Volatile Memories: Maintenance of Experience Count and Passive Techniques," filed Jan. 5, 2009, 73 pages.

U.S. Appl. No. 12/348,825 entitled "Spare Block Management in Non-Volatile Memories," filed Jan. 5, 2009, 76 pages.

U.S. Appl. No. 12/348,891 entitled "Non-Volatile Memory and Method With Write Cache Partitioning," filed Jan. 5, 2009, 151 pages.

U.S. Appl. No. 12/348,895 entitled "Nonvolatile Memory With Write Cache Having Flush/Eviction Methods," filed Jan. 5, 2009, 151 pages.

U.S. Appl. No. 12/348,899 entitled "Non-Volatile Memory and Method With Write Cache Partition Management Methods," filed Jan. 5, 2009, 149 pages.

U.S. Appl. No. 12/478,997 entitled "Folding Data Stored in Binary Format into Multi-State Format Within Non-Volatile Devices," filed Jun. 5, 2009, 52 pages.

U.S. Appl. No. 12/642,740 entitled "Atomic Program Sequence and Write Abort Detection," filed Dec. 18, 2009, 60 pages.

U.S. Appl. No. 61/142,620 entitled "Non-Volatile Memory and Method With Improved Block Management System," filed Jan. 5, 2009, 144 pages.

\* cited by examiner

When FSE = 1:

TECHNIQUES FOR ACCESSING COLUMN SELECTING SHIFT REGISTER WITH SKIPPED ENTRIES IN NON-VOLATILE MEMORIES

FIELD OF THE INVENTION

This invention relates generally to non-volatile memories and their operation, and, more specifically, to techniques for accessing the memory efficiently while accounting for defective columns of the memory array.

BACKGROUND OF THE INVENTION

The principles of the present invention have application to various types of non-volatile memories, those currently existing and those contemplated to use new technology being developed: Implementations of the present invention, however, are described with respect to a flash electrically-erasable and programmable read-only memory (EEPROM), wherein the storage elements are floating gates.

A number of architectures are used for non-volatile memories. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, 6,151,248, 6,426,893, and 6,512,263.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the U.S. Pat. No. 6,522,580, that is also hereby incorporated by reference, and references contained therein.

A memory will often have defective portions, either from the manufacturing process or that arise during the operation of the device. A number of techniques exist for managing these defects including error correction coding or remapping portions of the memory, such as described in U.S. Pat. No. 5,602,987, that was incorporated by reference above, or U.S. Pat. Nos. 5,315,541, 5,200,959, and 5,428,621, that are hereby incorporated by reference. For instance, a device is generally thoroughly tested before being shipped. The testing may find a defective portion of the memory that needs to be eliminated. Before shipping the device, the information on these defects is stored on the device, for example in a ROM area of the memory array or in a separate ROM, and at power up it is read by a controller and then used so that the controller can substitute a good portion of the memory for the bad. When reading or writing, the controller will then need to refer to a pointer structure in the controller's memory for this remapping. Having the controller manage this process has the disadvantage of requiring a lot of exchange of information between the controller and the memory portion, and, even within the controller itself, requires the pointer to be read whenever data is transferred. The mapping out of defective elements, such as bad columns in the memory, may be done in a manner that is transparent to the controller. This can make randomly accessing memory elements complicated as any address translation may not take into account mapped out elements.

SUMMARY OF THE INVENTION

A method is presented for accessing a non-volatile memory circuit. The memory circuit includes an array non-volatile memory cells formed along multiple columns, the array having a series of first shift registers connected to it, each first shift register connected to a distinct plurality of N of the columns. As a pointer moves through the series of first shift registers in response a clock signal one of the columns connected to it is selected and the pointer loops through the series of first shift registers N times to access all of the columns. Each column has an associated bit indicating whether it is defective, in response to which the first shift register skips the corresponding defective column in the series. The method includes maintaining in the non-volatile memory a count of the number of defective columns for each loop except the last in the series. An address is received and the method determines the corresponding loop and residual column address within the corresponding loop for the received address if none of the columns were defective. From the count of defective columns for each loop, the method determines the cumulative number of defective columns for the loops preceding the loop to which the received address would correspond if none of the columns were defective. The method offsets the residual column address within the corresponding loop to which the received address would correspond by the cumulative number of defective columns for the preceding loops and, starting from the offset column address in the corresponding loop, subsequently shifts through the columns to account for defective columns in the corresponding loop.

In other aspects, a non-volatile memory circuit is presented. The circuit includes an array of non-volatile memory cells formed along multiple columns. A series of first shift registers is each connected to a distinct plurality of N of the columns connected to receive a clock signal. As a pointer moves through the series of first shift registers in response the clock signal one of the columns connected to it is selected and the pointer loops through the series of first shift registers N times to access all of the columns. Each column has an associated bit indicating whether it is defective, in response to which the first shift register skips the corresponding defective column in the series. The memory circuit maintains in the non-volatile memory a count of the number of defective columns for each loop except the last in the series. The circuit also includes decoding circuitry that, in response to a received address, determines the corresponding loop and residual column address within the corresponding loop for the received address if none of the columns were defective, determines from the count of defective columns for each loop the cumulative number of defective columns for the loops preceding the loop to which the received address would correspond if none of the columns were defective, and offsets the residual column address within the corresponding loop to which the received address would correspond by the cumulative number of defective columns for the preceding loops. The memory also has a second series of shift registers, each of the second series of shift registers associated with a corresponding shift register from the first series, whereby the offset column address is subsequently shifted through the columns to account for defective columns in the corresponding loop.

The foregoing features may be implemented individually or together in various combinations, depending upon the specific application. Additional aspects, advantages and features of the scrubbing system herein are included in the following description of exemplary examples thereof, which description should be taken in conjunction with the accompanying drawings. All patents, patent applications, articles and other publications referenced herein are hereby incorporated herein by this reference in their entirety for all purposes.

DESCRIPTION OF EXEMPLARY EMBODIMENTS

Figure 1:
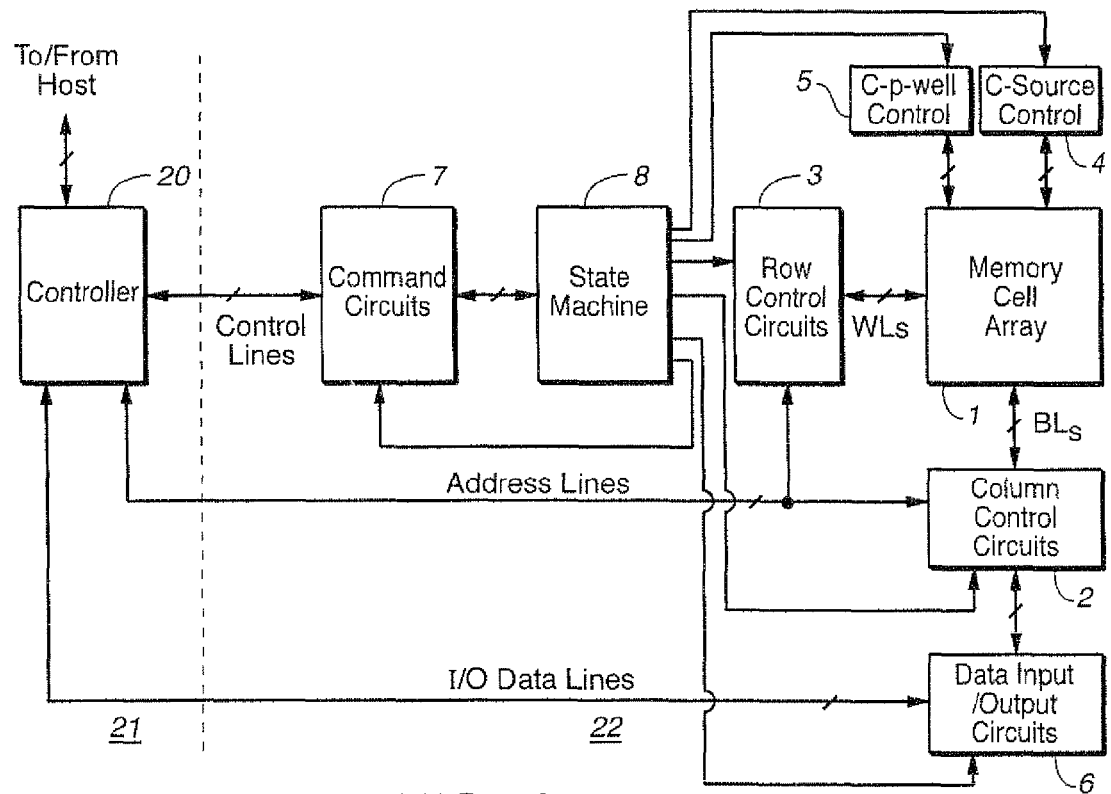
FIG. 1 is a block diagram of a non-volatile memory system in which the various aspects of the present invention are described to be implemented.

With reference to FIGS. 1-6, a specific non-volatile memory system is described in which the various aspects of the present invention are implemented, in order to provide specific examples. FIG. 1 is a block diagram of a flash memory system such as that described in U.S. Pat. No. 6,522,580, incorporated by reference above. Memory cell array 1 including a plurality of memory cells M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region (labeled as "WELL R" or "WELL L" in FIG. 2b) on which the memory cells (M) are formed. The c-source control circuit 4 controls one or more common source lines (labeled as "c-source L" and "c-source R" in FIG. 2b) connected to the memory cells (M). The c-p-well control circuit 5 controls the voltage of the c-p-wells. In some embodiments there may be a single p-well (rather than the two shown in FIG. 2b) and there may be a single c-source connection (rather than separate c-source L and c-source R).

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface connected to external control lines which are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

Figure 2A:
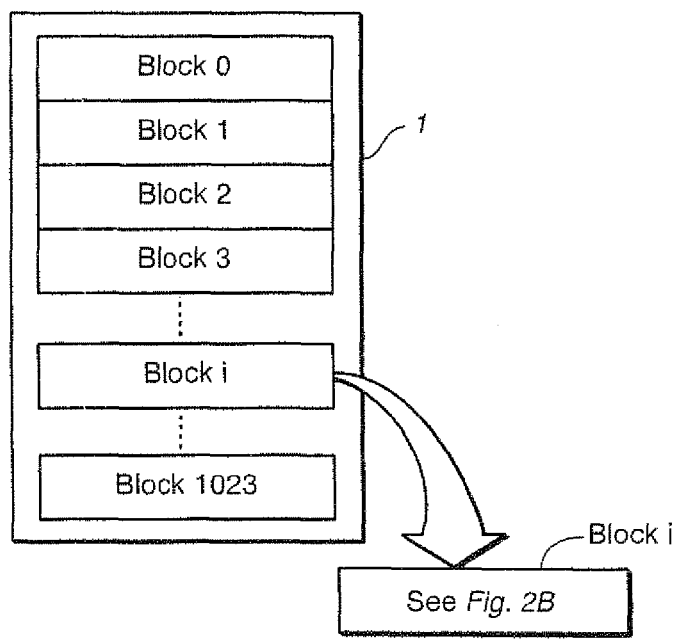
FIGS. 2a and 2b illustrates aspects of the present invention in a circuit and organization of the memory array of FIG. 1 when a NAND type.
Figure 2B:
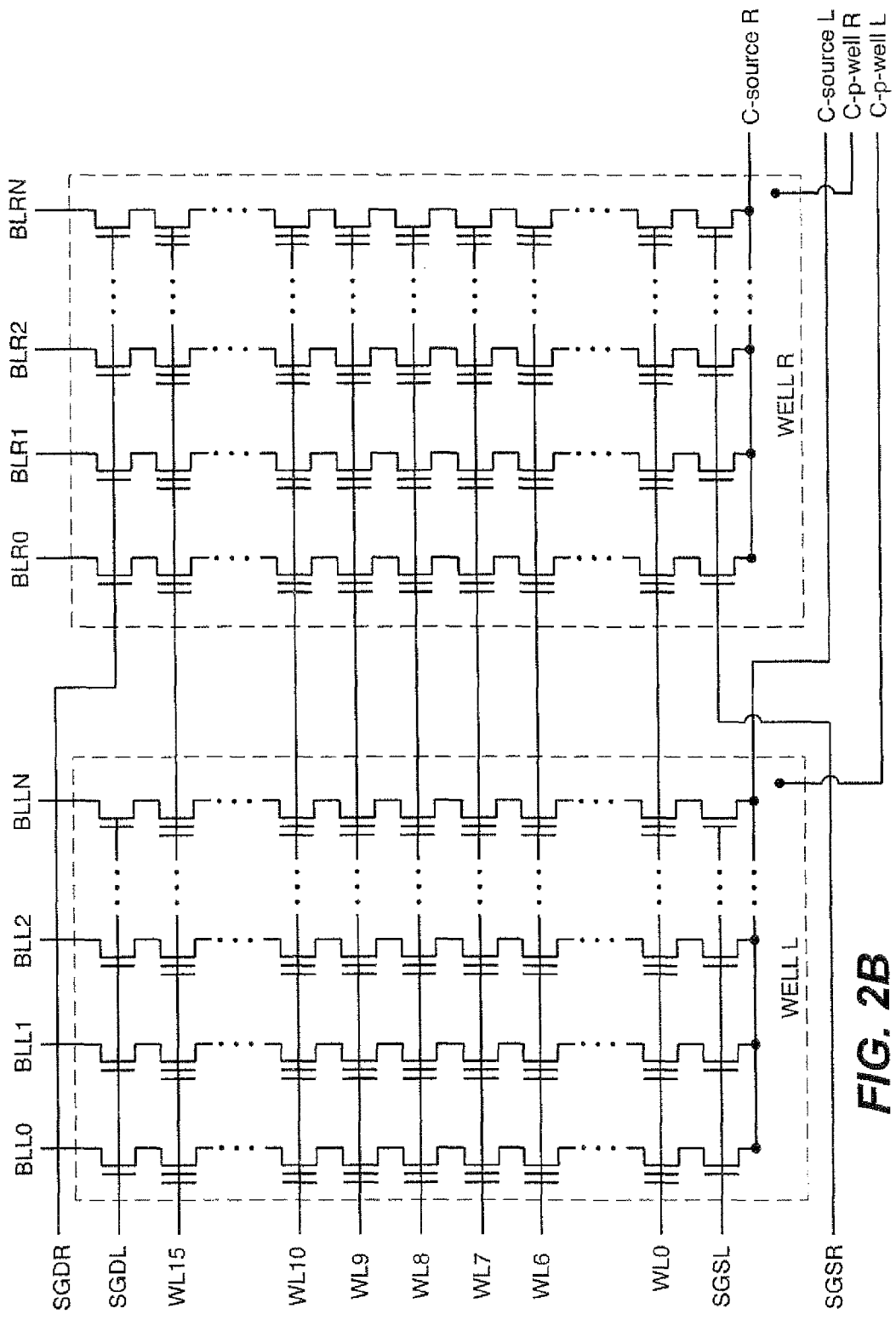

An example structure of the memory cell array 1 is shown with reference to FIGS. 2a and 2b, which is further described in a U.S. patent application Ser. No. 10/086,495, "Operating Techniques for Reducing Program and Read Disturbs of a Non-Volatile Memory", by Yan Li, Jim Chen, and Raul-Adrian Cernea, filed Feb. 27, 2002, 2002 and published Aug. 28, 2003 as number 2003016182, which is hereby incorporated by reference. A flash EEPROM of a NAND type is described as an example. The memory cells (M) are partitioned into 1,024 blocks, in a specific example. The data stored in each block are simultaneously erased, the block being the minimum unit of a number of cells that are simultaneously erasable. In the exemplary embodiment of U.S. patent application "Operating Techniques for Reducing Program and Read Disturbs of a Non-Volatile Memory", the division of the main array into Left and Right arrays sized to accommodate a small page size (512 bytes) and other aspects are described in more detail. The bit lines are also divided into left bit lines (BLL) and right bit lines (BLR). A number of redundant columns are arranged in the middle of the two sub-arrays, as discussed below. Sixteen memory cells connected to the word lines (WL0 to WL15) at each gate electrode are connected in series to form a NAND cell unit. One terminal of the NAND cell unit is connected to corresponding bit line (BL) via a first select transistor whose gate electrode is coupled to a first select gate line (SGDL or SGDR), and another terminal is connected to the c-source via a second select transistor whose gate electrode is coupled to a second select gate line (SGSL or SGSR). Although sixteen floating gate transistors are shown to be included in each cell unit, for simplicity, other numbers of transistors, such as 4, 8, or even 32, are used.

As discussed in the Background section, in the prior art the removal of bad columns and other defect management is generally managed by the controller. The information on defective portions of the memory is often maintained on the memory 22, such as in a ROM memory or in the header or spare portions of sectors of the array 1, as described, for instance, in U.S. Pat. No. 5,602,987, that was incorporated by reference above. For example, a ROM portion of the memory 22 may maintain an inventory of bad columns of the array 1, as determined and stored in the ROM when the memory is tested. At power up, the controller 20 would read the list of bad columns into a pointer structure. During a read or write process, the controller would consult this pointer structure and, when a logical address from the host corresponds to a bad column, substitute the address of a replacement column that is then sent along the address lines to the column control circuits 2.

One prior art system managing defective columns on the memory chip itself uses a binary decoding scheme to manage bad column replacement. The address from the host is first latched into a register and the column address is incremented by a 10-bit adder to manage the columns from 0 to 540 bytes. The column address (10 bits) is then pre-decoded into 15 to 20 lines which run through the column decoder area. Three signals are chosen from among these 15 to 20 lines to form a column select. Bad columns in this binary decoding system are managed by comparing an incoming column address with a list of bad column addresses. If a match is found, the incoming column address is reassigned to another, good column address. If the incoming address does not match the bad column addresses, the incoming column address is not changed. The binary column select scheme has a high degree of flexibility in locating random column addresses. However, it has the disadvantage is that it is relatively slow because of the multiple stages of logic necessary to replace a defective column, and this makes it difficult for the binary decoding scheme to run much faster than a 20 MHz data input or output rate.

FIGS. 3-6 show examples of a circuit architecture in which the present invention could be applied and are adapted from U.S. Pat. No. 6,560,146 which is hereby incorporated by reference. FIGS. 3a-c show examples of a circuit for reading and writing data to memory cells 301 of an integrated circuit. The integrated circuit may be a memory such as a Flash chip or may be an integrated circuit with an embedded memory portion, such as an ASIC or microprocessor with memory.
Flexible and Area Efficient Column Redundancy Read-write (SA) circuits 303 are coupled to columns of one or more bit lines of memory cells. The read-write circuits are used to read the states of the memory cells. The read-write circuits may also be used to write or store data into the memory cells. The read-write circuitry may include sense amplifier circuits, as discussed further below with respect to the embodiment of FIG. 8.

Figure 3A:
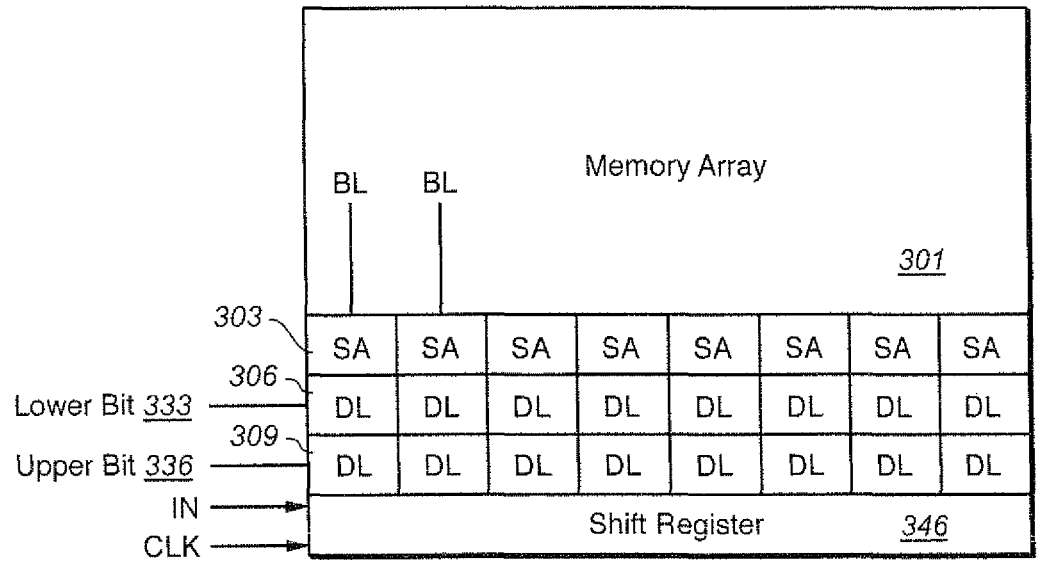
FIGS. 3a-c show integrated circuits with latches for holding data to be read and written into the memory.
Figure 3B:
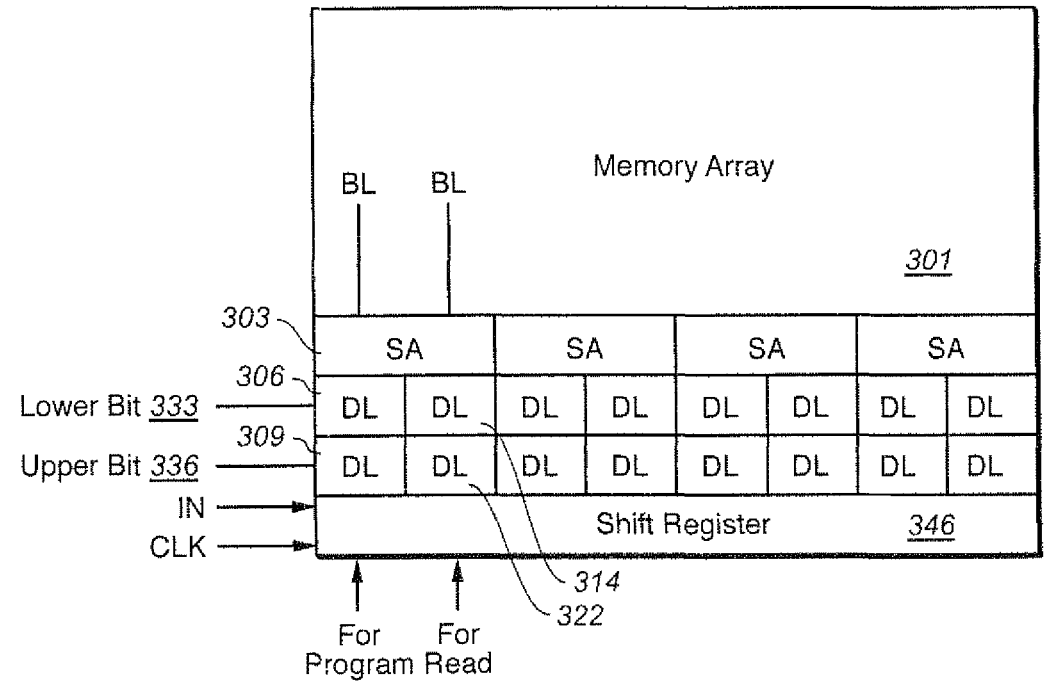
Figure 3C:
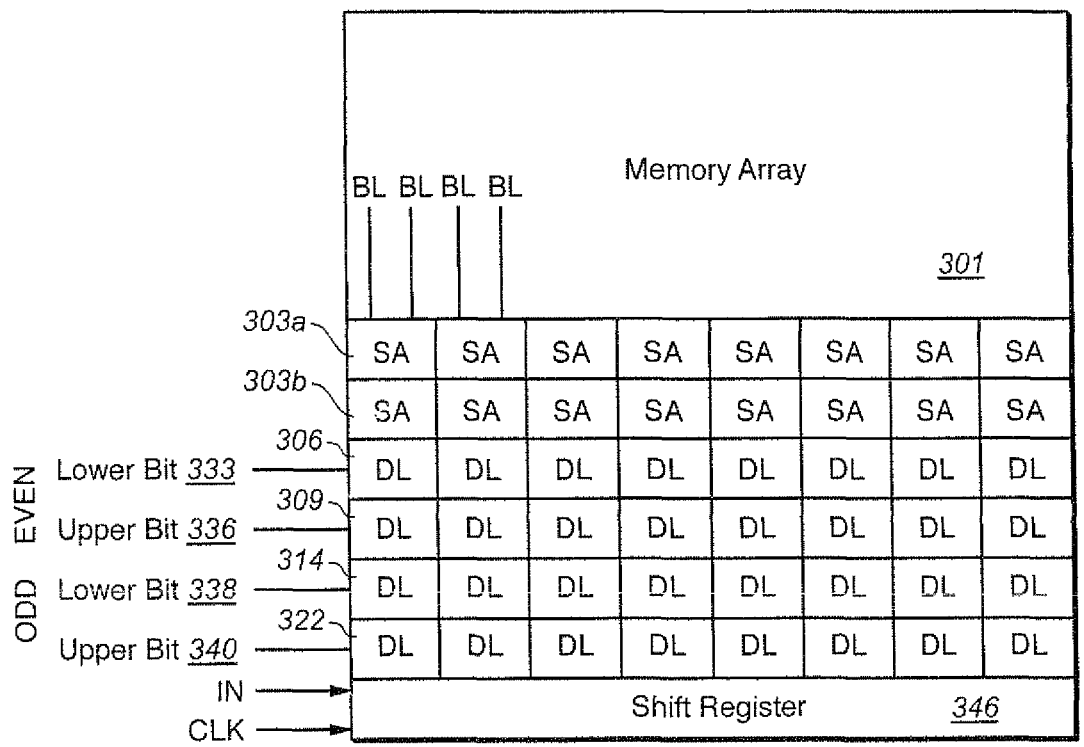

A number of arrangements can be used for the latches and column select circuits. The embodiments of FIGS. 3a-c present different arrangements of the read-write circuit for the columns of memory cells. One arrangement is a "flat" structure, with each bit line having its own set of latches that can be directly accessed, either to load or output data, for transferring data to an input/output line in response to an enable signal from a column select circuit. In other embodiments, such as discussed further below with respect to FIG. 8, one read-write circuit may be shared among two or more columns of memory cells.

In the exemplary embodiments, the storage units are multi-state, capable of storing multiple bits of data per cell. For the purpose of serving as an exemplary embodiment to illustrate the principles of the invention, memory cells 301 of FIGS. 3a-c are dual-bit Flash EEPROM memory cells, so that the collection of memory cells selected by one word line can store either one page of user plus overhead data or two pages of such data, referred to as an upper and lower page. More generally, the concepts readily extend to either binary memory cells or multi-state memory cells that can store more than two bits of data. Similarly, the discussion extends to non-volatile memories with other forms of storage units as the principle aspects of the present invention relate to how the storage units are accessed and arranged, and are not particular to how the data is written to, stored on, or read from the storage units.

In the example of FIG. 3a, there are two temporary storage circuits or data latches DL 306 and 309, one for the "upper" bit and one for the "lower" bit associated with and connected to each read-write circuit SA 303. The temporary storage circuits may be any circuitry used to hold data for the memory cells. In a specific implementation, the temporary storage circuits are latches; however, other types of logic may also be used. Each latch is connected to one of two input/output (I/O) lines, 333 and 336, used to input and output data into the latches. The details of the connection are not shown. In this simplified example, the latches and lines serve both the input and output function, although separate lines can also be used.

In the data input process, data is loaded bit-by-bit or more commonly byte-by-byte into the data latches. The Y-select circuits, such as 346, are used to manage which byte is selected at a specific WE (write enable) clock. Data is loaded into a particular latch based on a WE signal input of each latch (not shown in FIG. 3). When the WE signal is asserted (active low or active high signal) for a particular latch, then that latch is loaded. For example, in FIG. 3c the Y-select circuit 346 will select a particular data set on the I/O bus (lines 333, 336, 338, 340) that will then be connected to the selected data latches (306, 309, 314 and 322), which can be similar to those in FIG. 4.

In the data output processes, the data can be read out serially from a column of registers at a time. The Y-select will select a byte at a specific RE (Read Enable) clock. The data will transfer from the data latch to the I/O bus and from there the data will be transferred to the output buffer.

In FIG. 3b, each input/output circuit 303 has four associated data latches, 306, 309, 314, and 322, with the first two respectively corresponding to the lower and upper bits for programming and the second two respectively corresponding to the lower and upper bits for reading.

In a folded structure, such as FIG. 3c (or FIG. 8, below), multiple input/output circuits such as 303a and 303b are stacked on top of each other. In this example, one of the input/output circuits belongs to an odd bit line and the other belonging to an even bit line. In a two bits per cell arrangement, there is a corresponding upper bit and lower bit data latch for each input/output circuit. As in FIG. 3a, the same latch is used for both the read and program data, although in a variation separate data latches for program and read can be used. As is described more with respect to FIGS. 7a and 7b, since this is a folded structure, the strobe pulse of the shift register will travel first in one direction, say from right to left, to access one of the bit lines, and when it meets the (counter defined) boundary, the strobe will turn around to go from left to right to access the other of the bit lines.

The I/O connections can have several options. In one case where the two bits stored in one physical cell belong logically to the same page and are written at the same time, it may be convenient to use two I/O lines, 333 & 336, to load the corresponding data latches 306 and 309 simultaneously (FIG. 3a). In the case of separate data latches for program and read as in FIG. 3b, the data latches 306 and 309 for program may be connected to DIN lines (Data In lines from input buffer), and the data latches 314 and 322 used for reading may be connected through I/O lines to output buffers.

In a another case often used in traditional NAND architectures, as described in U.S. patent application Ser. No. 10/086, 495 incorporated by reference above, the lower bit data and upper bit data stored in each physical cell logically belong to different pages and are written and read at different times. Therefore, the lower bit data latch and the upper page data latch will be connected to same IO line.

Figure 4:
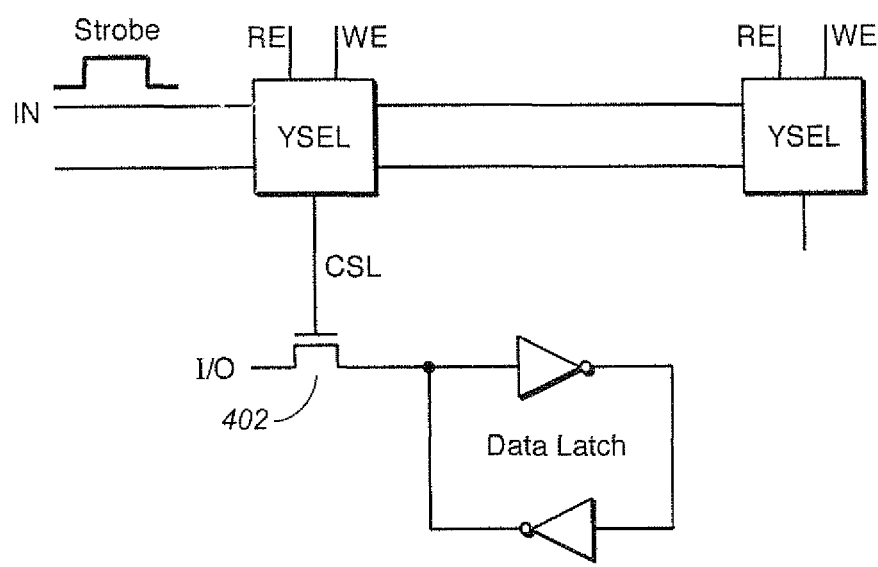
FIG. 4 shows an implementation of a latch.

An example of a specific circuit implementation of a latch is shown in FIG. 4. An input I/O is the data input to the latch, such as 306, and will be connected to an input line, such as 333. The column select signal CSL is connected to a pass transistor or pass gate 402 that allows data to be connected to or disconnected from the input. The signal CSL is supplied from the Y or column select circuit YSEL that corresponds to one stage of the shift register 346 of FIGS. 3a-c. This example of a latch circuit includes cross-coupled inverters to hold data and also connects to the read-write circuit so that data may be passed between the circuits. Other circuit implementations for a latch may also be used, such as NAND, NOR, XOR, AND, and OR gates, and combinations of these.

In this example, a read enable signal RE and write enable signal WE will be the clock to control the YSEL. A strobe will be propagated along the YSEL stages of the shift register. In the case of a folded structure, when the pulse reaches the last stage, it will propagate back in the other direction. When CSL is high, the data latch will be selected. The I/O line will then get the data from or put the data into the data latch. There are other possible implementations than a single input/output (I/O) line as described with respect to FIG. 3b.

The exemplary embodiment of FIG. 4 shows an NMOS or n-channel pass transistor. There are many ways to form a pass gate and any of these techniques may be used. For example, a CMOS pass gate, that includes NMOS and PMOS transistors connected in parallel, may be used. Also, a high voltage pass gate may be used. For example, a high-voltage NMOS pass gate is enabled or turned on (or placed in an on state) by placing a high voltage, above VCC, at its gate or control electrode. An NMOS pass gate is turned off or put in an off state by placing its control electrode at VSS or ground.

U.S. Pat. No. 6,560,146, which was incorporated by reference above, describes several arrangements for the relation of the data I/O lines and the data latches in more detail. If the data latch is "flat", as shown in FIGS. 3a and 3b, then the lines connected to 306, 309, 314, 322 belong to different I/O lines.

In the FIG. 3a embodiment, each read-write circuit is connected to and has two latches associated with it that serve as both input and output latches. Alternately, as in FIG. 3b, two of these latches can be used to hold the data to be written into the memory cell, and two latches are used to hold the data read out of the memory cell.

The write data is input into the latches via the appropriate input lines and then written using the appropriate read-write circuit into the memory cells. Data from the memory cells is read out using the sense amplifier and stored into the latches. The read data is output from the latches using the appropriate output lines. The communication line between the latch and the read-write circuit is not shown.

Data is input from the latches one at a time using the input lines. This is done by using a column select signal (CSL), as described above, so that the latches associated with a read-write circuit or column in the array are connected to the input lines one at a time. The CSL signal for the latches comes from the shift registers. The shift registers are loaded with a pattern (for active high logic) which is all 0s, except for one 1 (e.g., 0001000000). This bit may be referred to as a strobe bit. For example, shift register associated with the first column has a 1, and the rest of the shift register bits contain 0. This 1 is connected to the ENABLE input of the latches for the first column, which connects one or more of these latches to the I/O lines 333, 336, 338, and 340. Data can be read or written to this column. The input to the shift register is connected to 0 and the shift register is clocked. The 1 propagates to the next shift register stage. This 1 is connected to the ENABLE input of the latches for the second column, which connects these latches to the I/O lines. This operation continues until the desired data is read or written from the latches.

Figure 5:
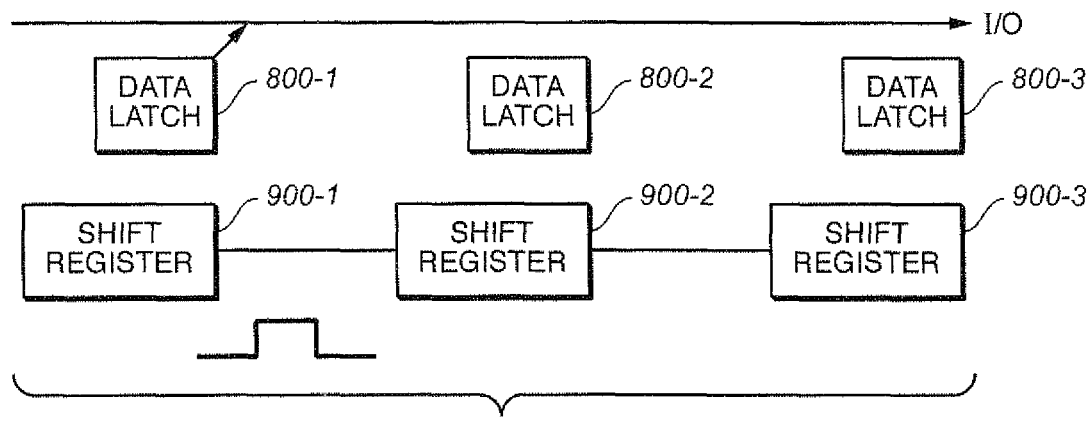
FIG. 5 shows connecting a first data latch to an I/O line by placing a 1 in a first stage of a shift register.
Figure 6:
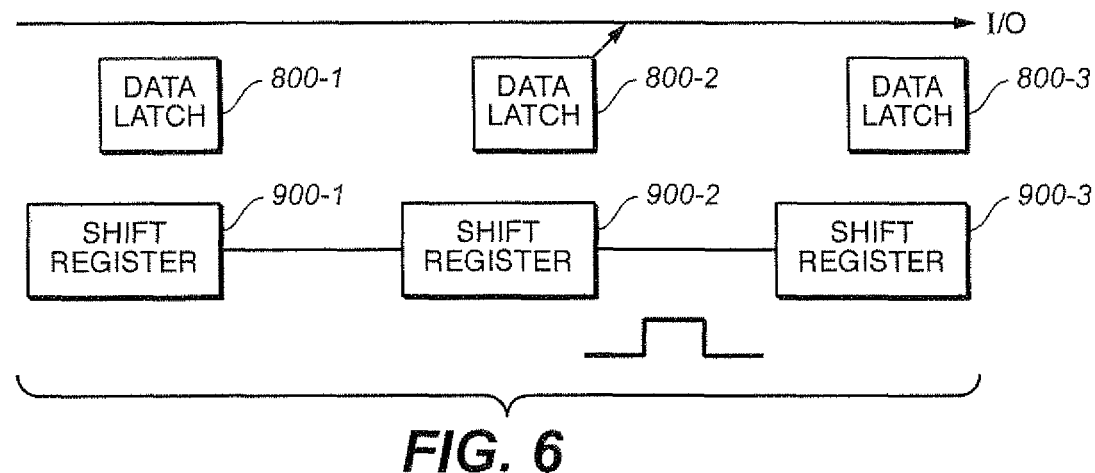
FIG. 6 shows connecting a second data latch to the I/O line by placing a 1 in a second stage of a shift register.

FIGS. 5 and 6 show more clearly the operation of latches and shift register. In FIG. 5, the first shift register has a 1; the data latch associated with that shift register and column is connected to the I/O line. In FIG. 6, the shift register has been clocked, and the next shift register bit has the 1; the data latch associated with that shift register and column is connected to the I/O line. The circuitry may also be designed for an active low LOAD signal. Then, the shift register will contain all 1s and a 0 for the particular latches to be enabled (e.g., 1110111111).

The preceding discussion illustrates the general principles involved and assumed that there is one (or two) bit lines per sense amp and one shift register stage per one or two sense amps. However, the concept can be usefully generalized such that there is one shift register stage per group of sense amps, the group of bit lines forming a column block. For example, there may be one or a few bytes of data associated with one column block, requiring, for example, 8 to 32 input lines in place of the one to four input lines shown in FIGS. 3a-3c. In one specific example following the structure of FIG. 3a, each single BL line would consist of 8 bit lines, Sense Amp 303 would read from and write to each of the 8 bit lines, each Data Latch 306 and 309 would hold 8 bits of data, and the upper bit and lower bit lines 333 and 336 would each be 8 bits wide. This allows a byte of data to be entered or read from each column block simultaneously.

In the case where one or more bit lines within a column block are bad, a method is needed to skip over the bad column block. For example, in the scheme of FIGS. 3-6, if one column within the column block associated with shift register 900-2 and data latch 800-2 were bad, then the memory needs to skip the entire column block. In the prior art, this would typically be accomplished by the controller not addressing the bad column and reassigning addresses, which, as it is not performed solely on the memory 22 (FIG. 1), is not readily accomplished in an embedded environment that has no controller. Instead, according to one aspect of the present invention, the pulse of FIG. 5 passes through shift register 900-2 without waiting for a second clock pulse and without selecting the latch 800-2 to supply data to the 110 line. In another aspect of the present invention, this process is handled entirely on the memory 22: In effect, shift register 900-2, data latch 800-2, and the column block with which they are associated become transparent as seen from the controller 20 or the host.

Figure 7A:
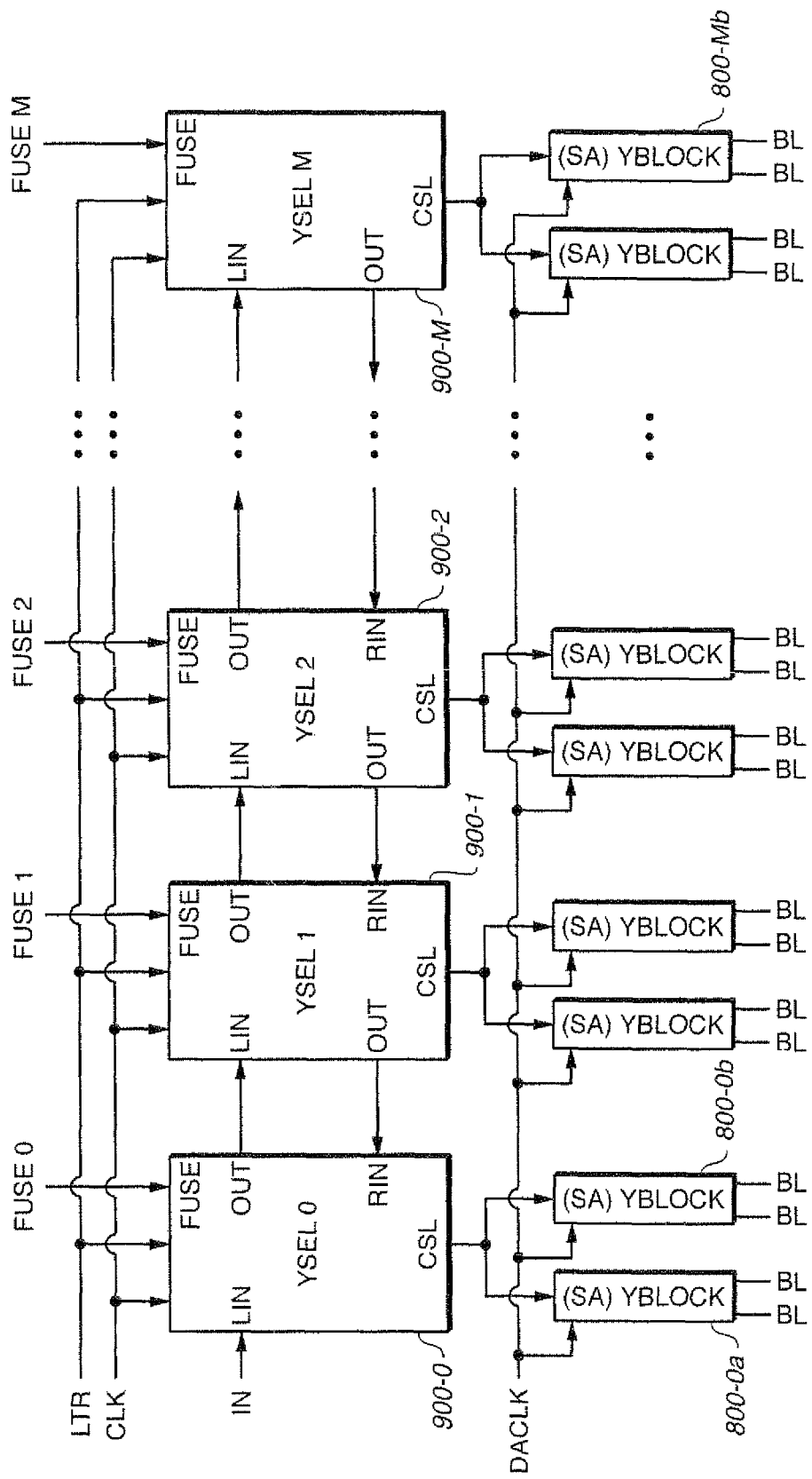
FIGS. 7a and 7b are block diagrams of an embodiment of the column select circuits and various control signals used in their operation.

FIG. 7A presents these and other aspects of the invention in a more general context. In this figure, the shift registers are replaced by the Y-select blocks YSEL 900-i, corresponding to the column control circuits of FIG. 1, and the data input/output circuits YBLOCK 800-i that compose part of the data input/output circuits 6 of FIG. 1. FIG. 7A shows the relation of these elements and various control signals used in their operation.

In FIG. 7A, series of M+1 Y-select blocks YSEL0 900-0 to YSELM 900-M receive a common clock signal CLK. The output OUT of each Y-select block 900-i is connected to the YSEL block on either side through a right input RIN and a left input LIN. Which of the two inputs RIN and LIN is active is determined by the left-to-right signal LTR: when LTR is high, LIN is active and each of the Y-select blocks 900-i shift the pulse to its neighbor on the right; when LTR is low, RIN is active and the pulse travels to the left. When a Y-select block receives the pulse from its neighbor, it asserts the signal CSL and passes the signal on to its other neighbor at the next clock cycle.

Each Y-select block 900-i has a distinct input FUSE that indicates whether the column is bad and needs to be skipped. When FUSE is set for a given Y-select circuit, CSL is not asserted and the shift register acts as a buffer to pass the pulse to the next stage so that the pulse passes through to the next Y-select block without waiting for the next clock cycle. The values for FUSE-i can be stored in a ROM portion of the memory 22 and read out at power up to set the FUSE signals to the Y-select blocks. The list of bad columns can be established when the memory is tested and written into the ROM.

Figure 7B:
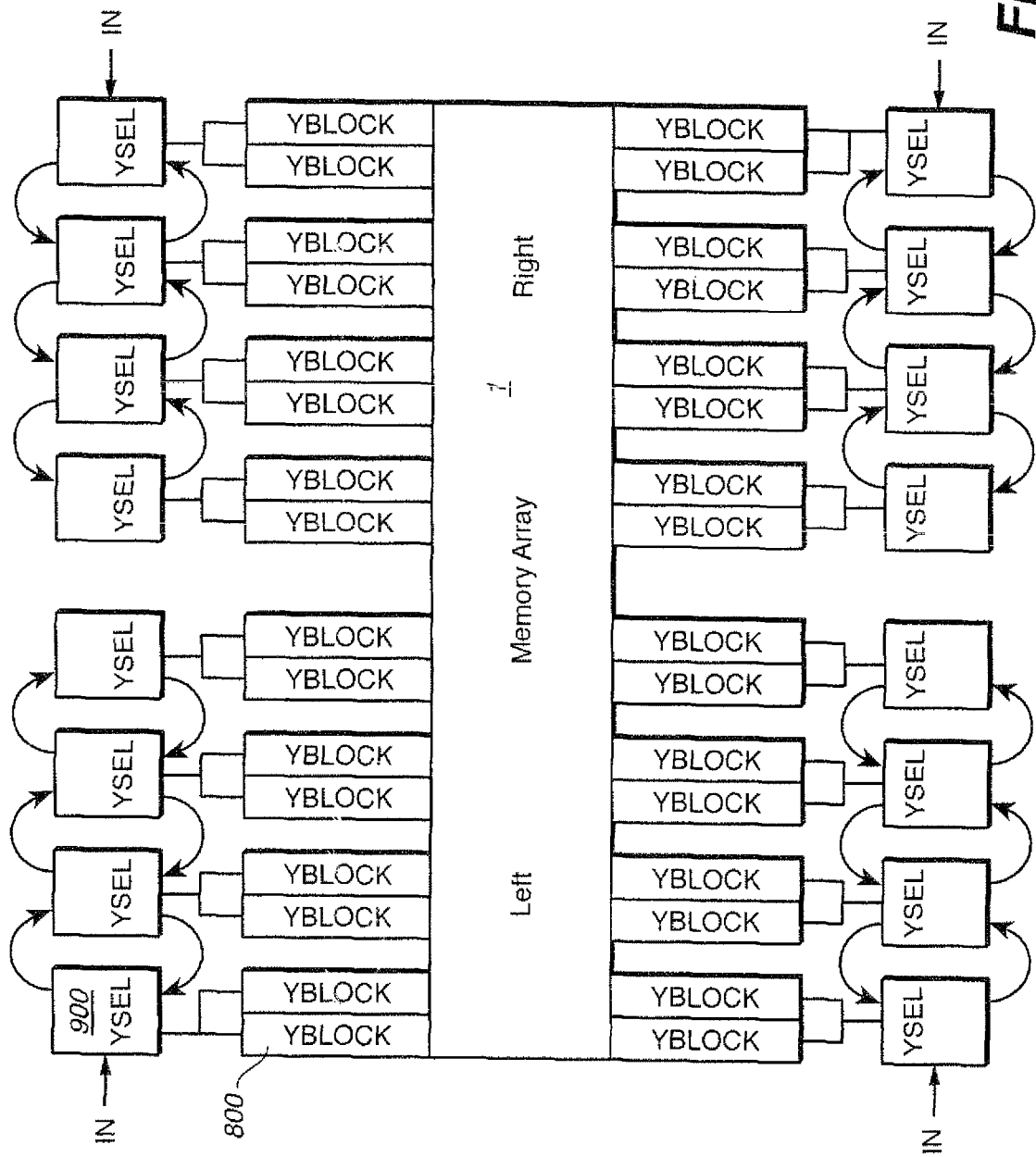

FIG. 7B shows an example of how the YSEL 900 and YBLOCK 800 circuits can be arranged with respect to the memory array. In FIG. 7B, the memory array 1 is again divided into a left and right potion as in FIG. 2B. As the left and right portion can be read and programmed independently, each side has an independent set of Y-select circuits 900 and input/output circuits YBLOCK 800 that would have their own input pulse IN into the first shift register in the chain of, here, 4 YSEL blocks. To improve the layout of the circuit, half of the YSEL/YBLOCK circuits in each side can be placed above the array 1, with the other half placed below, as shown in FIG. 7B. The arrangement in the array of the redundant columns used to replace defective columns is described below with respect to FIGS. 13a and 13b. In the specific case where the basic unit of data transfer in or out of the memory 22 is a byte, there would be at least 4 data I/O lines (or possibly 4 DATA IN lines and 4 DATA OUT lines) associated with the YBLOCK circuits on the top of the memory and another set of 4 data I/O lines associated with the YBLOCK circuits on the bottom of the memory. The state of the YSEL circuits, specifically CSL, controls which YBLOCK communicates with the data I/O lines at any given time.

The CSL signal from each Y-select circuit is connected to a corresponding set of programming, sensing, data storage, input and/or output circuits, shown here as YBLOCK 800-i. In the embodiment of FIGS. 3-6, each shift register was connected to only a single set of read/write circuits, but in general there can be more. In particular, FIG. 7A shows two YBLOCKs, 800-ia and 800-ib, associated with each YSEL 900-i.

Figure 8:
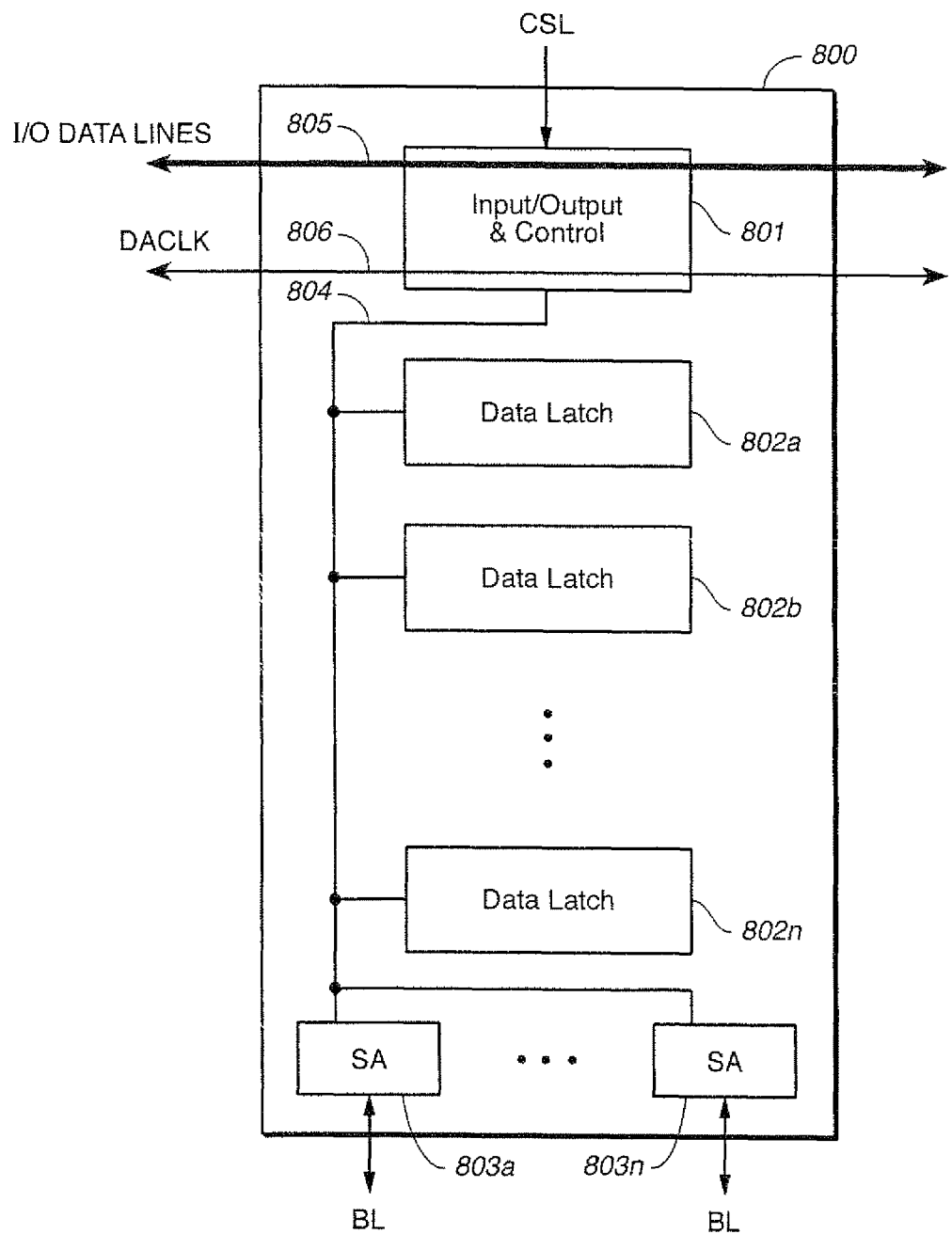
FIG. 8 is a block diagram of some elements of the data input/output circuits of FIG. 7A.

FIG. 8 is a block diagram of some elements of the data input/output circuits YBLOCK 800-i of FIG. 7A, and illustrates an additional embodiment of the invention in which multiple data latches can be incorporated into a column block. This can be useful for performing certain functions directly on the memory chip and requiring minimal data transfer between the memory chip and the controller, thus improving performance. For example, it is useful to have multiple data latches for receiving next page data during a sequential programming operation. While one set of latches contain the current data being programmed, a second set of latches can be loaded with new data for the next programming operation, allowing overlapped programming and data transfer. A second use for additional data latches occurs when data needs to be copied from one page to another page within the memory 22, or when each memory cell contains data from two different logical pages as described in U.S. Pat. No. 6,522,580.

The concept of multiple sense amps and data latches in a common Y-block has been described in U.S. patent application Ser. No. 10/254,483, "Highly Compact Non-Volatile Memory and Method Thereof", by Raul-Adrian Cernea, filed Sep. 24, 2002, published as US-2004-0060031-A1, which is hereby incorporated by reference. This patent application also describes a stack bus (similar to bus 803) by which the various components can be interconnected and data entered and exchanged between them and external I/O lines. Additional aspects of these and other elements are described further in U.S. patent application Ser. No. 10/254,919, filed Sep. 24, 2002, and published as US-2004-0057283-A1, and in U.S. patent application Ser. No. 10/665,828, filed Sep. 17, 2003, and published as US-2004-0109357-A1, both of which are also hereby incorporated by reference.

Y-Block 800 consists of multiple data latches 802a, 802b, through 802n that can store data to be used by the Sense Amps 803a through 803n for either reading or writing. A central control unit labeled Input/Output & Control 801 is used to control access to the global I/O Data Lines 805 when selected by input signal CSL from the associated YSEL circuitry. Each of the sense Amps 803a through 803n is associated with one or more bit lines (BL). In some NAND architectures it is common to associate two bit lines (odd and even) with each sense amp and read them at different times. In. other NAND architectures it is desirable to read all bit lines simultaneously, requiring one Sense Amp for each bit line. There may also be one or more dedicated data latches included within each Sense Amp. The fact that multiple Sense Amps are shown in this block is an indication that typically at least one or more bytes of data would be accessed by this block, though this is not a requirement. The data width of each Data Latch is typically as wide as the number of I/O Data Lines. For example, if there are 8 I/O Lines (or 8 Input Lines and 8 Output Lines) crossing the central control unit, each Data Latch would typically hold 8 bits.

In one embodiment, both the Sense Amps and the central control unit 801 can access the data latches at random and in any desired order. In this case bus 804 carries both data and control information. In another more restricted embodiment, the Data Latches may be accessed in series such that data is shifted from the central control unit 801 to Data Latch 802a, then from Data Latch 802a to Data Latch 802b, and so forth to Data Latch 802n. In this case the control signal DACLK 806 (described below in conjunction with FIG. 12) would be routed to each of the Data Latches to effect that transfer.

In a write process, the data is received from the I/O Data Lines 804 under control of CSL, from which it is supplied to one of the data latches. If the Data Latches are connected in series, it would be applied to Data Latch 802a and subsequently shifted through all the Data Latches to the Sense Amp and written into the memory. A read process is essentially the reverse in which data is read from the Sense Amps and placed in Data Latch 802n and shifted up through the other Data Latches to the I/O Data Lines 805. In an alternate embodiment (not shown), the I/O Data Lines consist of two sets of lines: Input Lines loading Data Latch 802a and Output Data Lines driven from Data Latch 802n.

Figure 9:
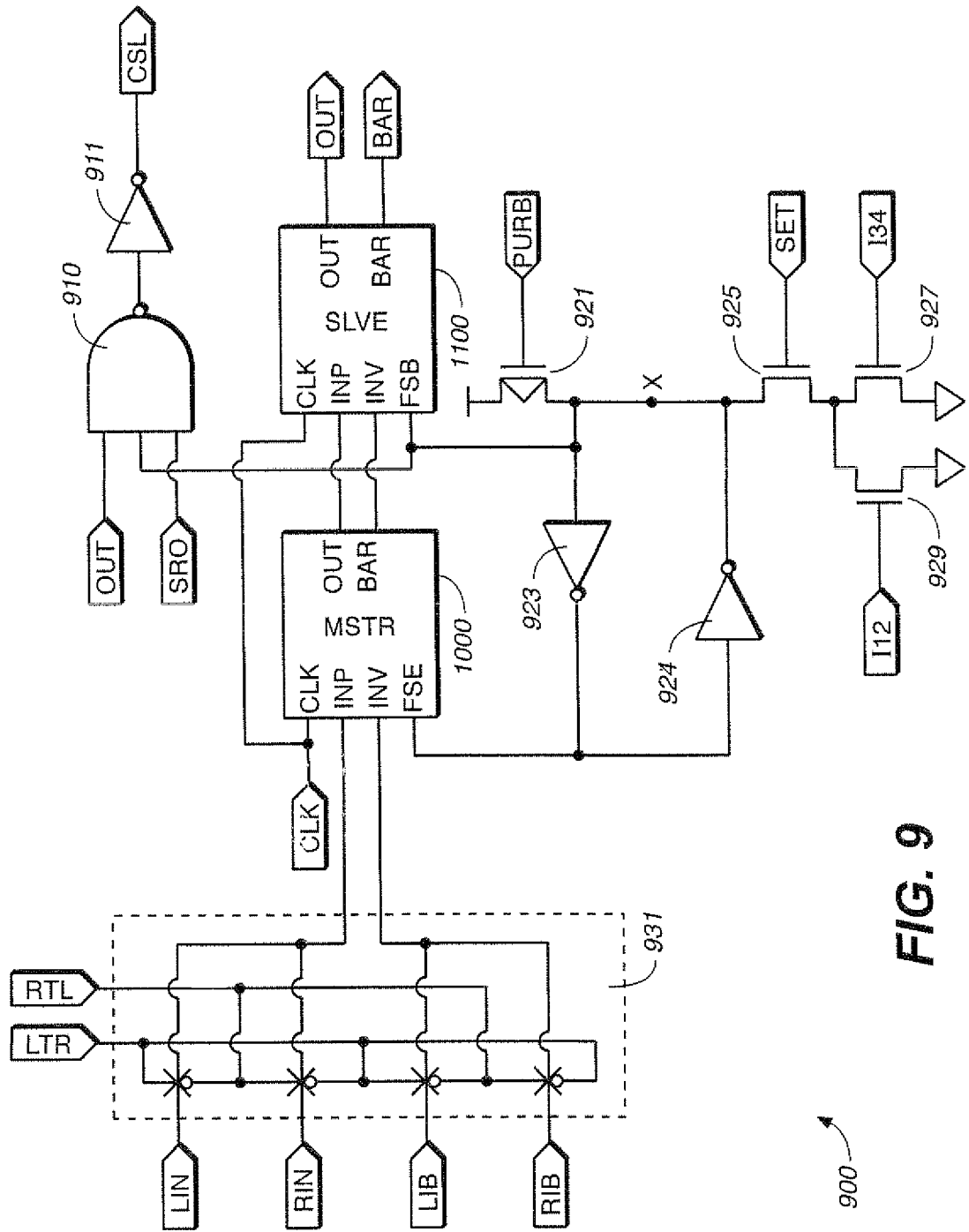
FIG. 9 is an exemplary embodiment of a Y-select block.

FIG. 9 is a schematic for an exemplary embodiment of the Y-select block 900. This particular embodiment is formed from a master latch MSTR 1000 and a slave latch 1100. Both latches are connected to the clock CLK, receive an input signal INP and its complement INV, and supply an output OUT and complement BAR. The signals OUT and BAR of the master latch 1000 are respectively connected to INP and INV of the slave 1100. The output of the slave latch is the OUT signal of block 900 in FIG. 7A, the inverse signals being suppressed in that figure.

The input INP of the master 1000 is connected to the left input LIN and right input RIN through switch 931, that also connects the inverse input INV of the master to the inverses of LIN and RIN, LIB and RIB respectively. When the left-to-right signal LTR is asserted, LIN is connected to INP and LIB to INV; when the right-to-left signal RTL, the inverse of LTR, is asserted, RIN and RIB are respectively connected to INP and INV. In this way, when an input pulse arrives from the Y-select block to the immediate left (for LTR asserted) or the immediate right (for RTL asserted), it is clocked through the master and slave latches and passed on to the following select block.

The output OUT of the slave SLVE 1100 is also supplied to NAND gate 910. Consequently, when the output OUT is high (and FSB, as explained below, is also high) and the clock pulse arrives, the NAND output goes low and is inverted by 911 to assert the column select signal CSL of the Y-select block. In this particular embodiment, the NAND gate 910 also receives an input labeled SRO to indicate the serial readout mode is enabled: in other embodiments, the SRO signal may be absent or replaced with other control signal to enable/disable the CSL signal. Although CSL is not clocked directly by applying CLK as an input of 910, as OUT is a clocked signal, CSL is clocked indirectly through this input.

The other input of NAND gate 910 is the fuse enable signal FSB, that is used to switch out a bad column block: unless FSE=$\overline{\text{FSB}}$ is set low, the column select signal will not be asserted. The value of FSE is held in the latch composed of the inverters 923 and 924. FSE is also supplied to master latch 1000 and its inverse FSB is supplied to slave latch 1100. These signals convert the latches into a pair of un-clocked buffers by essentially overriding the clock signal and passing the input of the Y-select block directly to the output. Many possible embodiments can be used for the master register 1000 and slave register 1100, with one particular example given in FIGS. 10 and 11.

The value of FSE is set through the signals PURB, SET, I12 and I34, which were collectively indicated as FUSE in FIG. 7A. This signals I12 and I34 are respectively connected to the transistors 929 and 927 and indicate whether the column block is bad. In the exemplary embodiment with a column having four bit lines, I12 corresponds to the first and second bit lines of the column and I34 the third and fourth. The values I12=I34=0 indicate the column is good, while either of I12=1 or I34=1 indicate a bad column. In other arrangements, for example, each bit line could have its own indicating transistor in parallel or all four could share a single transistor. At power up, the bad column values are read from the memory ROM and the values of I12 and I34 are set. Transistor 921 is then turned on to charge up node X by PURB, after which the charge is trapped, setting node X high. Transistor 925 is then turned on by a pulse of the signal SET. If the column is good, I12=I34=0 and the node X stays high setting FSB=1 and FSE=0; if the column is bad, I12=1 or I34=1 and node X is taken to ground setting FSB=0 and FSE=1.

The bad column information can be saved in a designated ROM block for transfer to update the shift register latch (or column isolation latch) in FIG. 9. In an embodiment based on FIG. 9, a certain data pattern saved in a first word line of the ROM memory, with "1" indicating a bad column, "0" indicating a good column. The reversed data will be saved in a second wordline. The purpose in storing both the data and its inverse is to insure the integrity of the stored data. If a bit line (in the metal) is physically open or shorted or has another fault, then both the bad column data and its inverse cannot read out correctly. In that case, the column can be automatically discarded. At power up, a two read sequence is to be executed to read the data from the first ROM word line first and compare this with the data read from the second wordline. If the data is good data, then it will be used to set the column isolation latch composed of inverters 923 and 924 in FIG. 9. This method allows a direct one-to-one correspondence between the ROM data to the column latches, which makes updating the latches more straightforward. However, as the bad column information is only saved once, the integrity of the data is less robust through the lifetime of the chip. This method is useful in the NOR structure where read disturbs are less prevalent since there are no other cells in the read chain to be affected by reading a particular cell, as in the NAND architecture where all the cells in the chain can be affected.

In another method for updating the bad column information from the designated ROM block to the shift register latch in FIG. 9, the list of bad columns is stored in more than one location. This method will be more robust in memory systems more prone to disturbs and can be used in memories with a "plane" structure, such as described in U.S. Pat. No. 6,426,893, which is hereby incorporated by reference. After test and evaluation, the bad column addresses can be stored in the designated ROM blocks, with both the information and its inverse stored on the same page. In this embodiment, the address information is also duplicated in the ROM block of the other planes.

For example, if the memory chip has two planes, and there are left and right sub-arrays in each plane, then the bad column addresses are saved in 4 pages in the ROM blocks on the same WL. The data is saved on the same WL for instant read-out upon power up. In this way, four copies of same data will be readout in one read, and the data will be compared to eliminate the bad data. The column address data can then be temporarily loaded into a register. The Shift Register will toggle through every column, if the column address matches the bad column address, the SET signal will go high to set node X in FIG. 9 low. In this method, only one of the pull down transistors 927 and 929 are needed, and the signal to the gate of the remaining transistor changed. For example, here FIG. 9 would be modified so that transistor 929 can be deleted and the input to the gate of transistor 927 will now be the signal CSL instead of I34.

Figure 10:
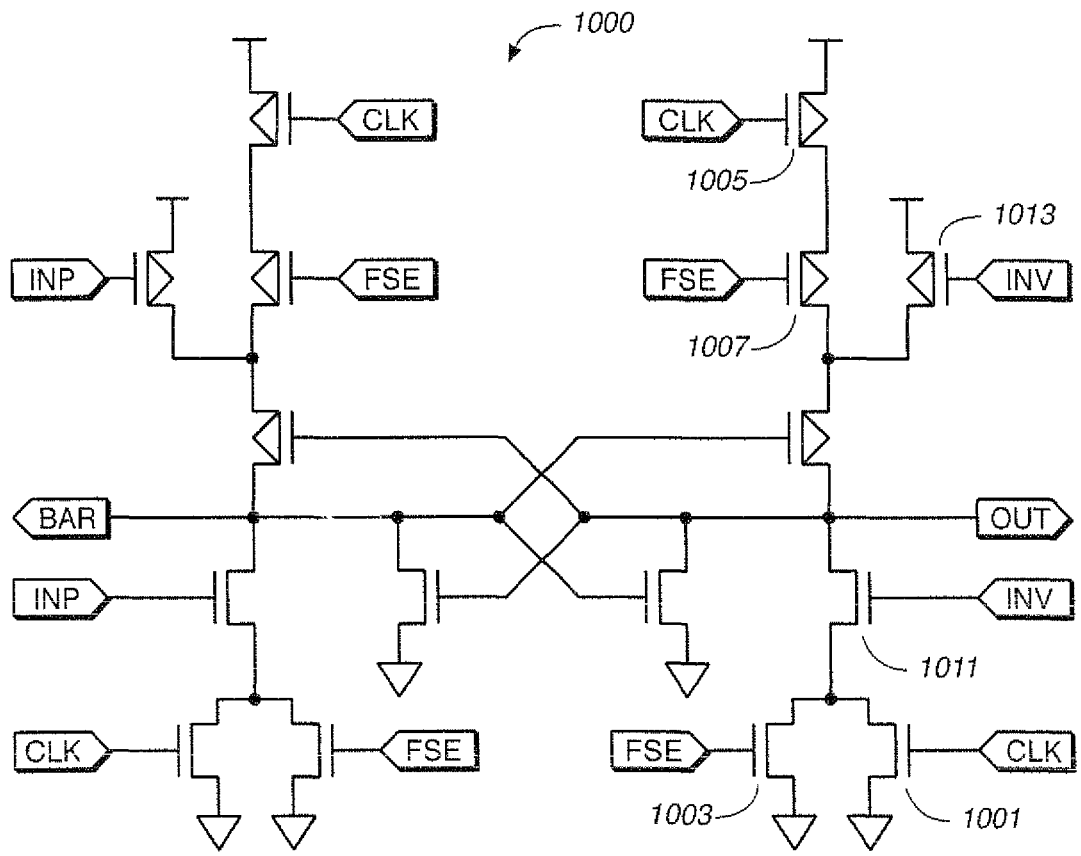
FIG. 10 is a schematic of an exemplary embodiment for the master latch.
Figure 10:
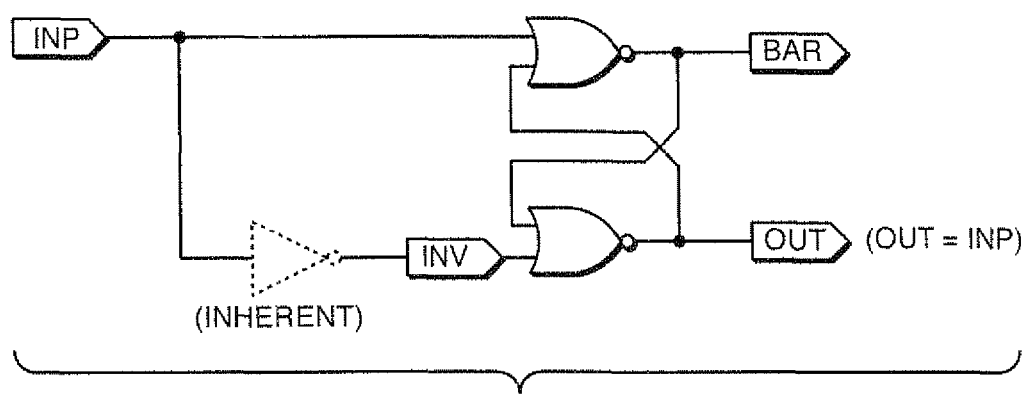

FIG. 10 is a schematic of an exemplary embodiment of the master latch 1000. As shown on the right hand side of latch 1000, transistors 1001 and 1003 respectively controlled by CLK and FSE are connected in parallel between the OUT node and ground, with PMOS transistors 1005 and 1007 again respectively controlled by CLK and FSE connected in series between the high logic value and the OUT node. Consequently, when the signal FSE=1 is asserted, the CLK signal is overridden and is unable to affect the output of the circuit. The cross-coupled left hand side of FIG. 10 operates in a complementary manner to the right side using INP as the input and providing BAR as the output. When FSE=1, FIG. 10 then degenerates into a pair of cross-coupled NOR gates arranged as a set-reset latch with INP and INV as the two input signals, and OUT=INP at all times (since INV is always the complement of INP). Functionally in this condition the circuit acts as a logical buffer.

Figure 11:
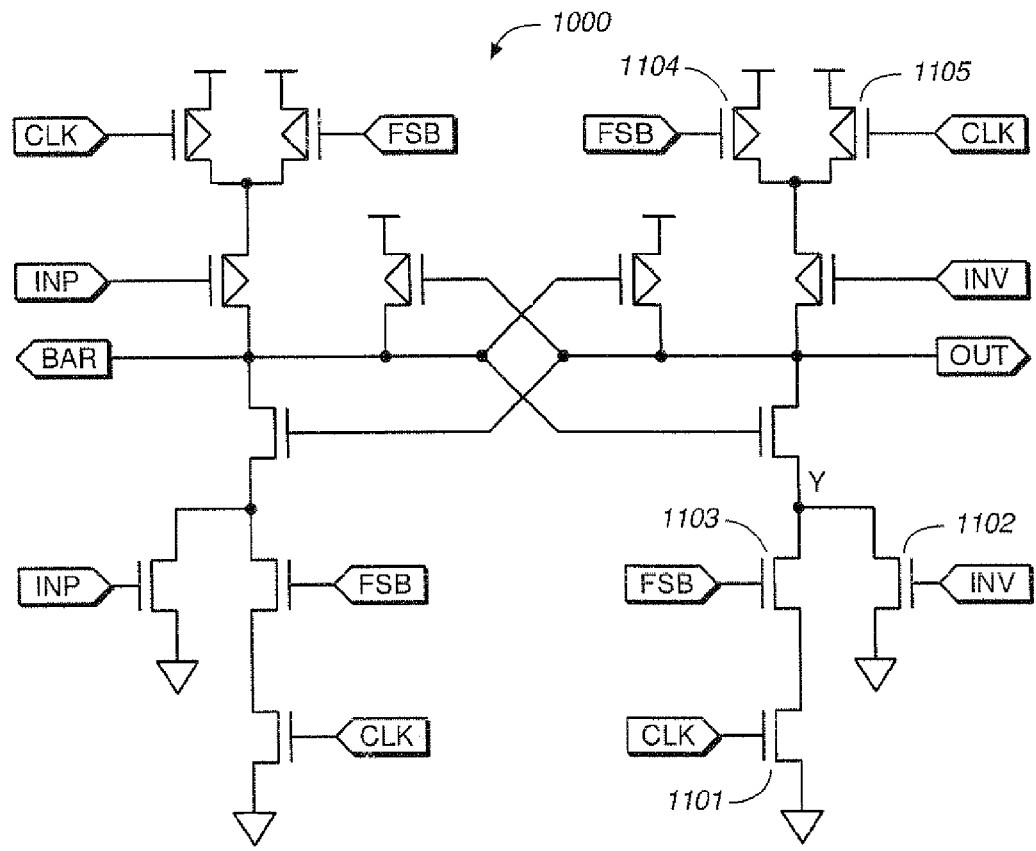
FIG. 11 is a schematic of an exemplary embodiment for the slave latch.
Figure 11:
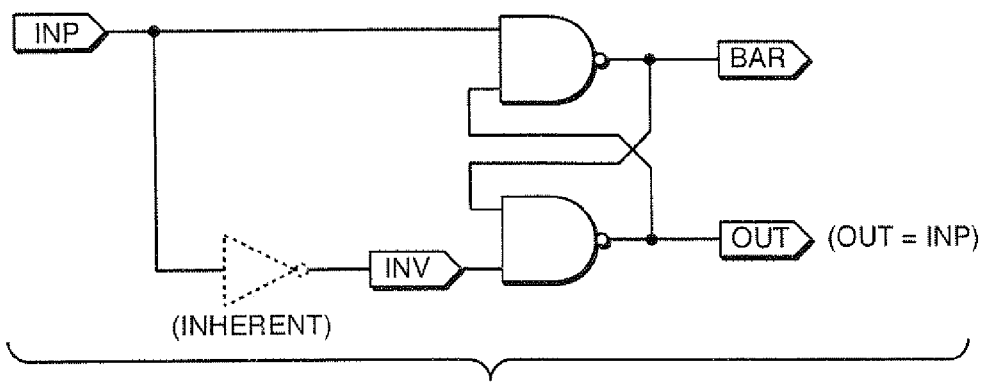

FIG. 11 is a schematic of an exemplary embodiment of a slave latch 1100 constructed in a complementary manner to the master latch 1000 of FIG. 10. As shown on the right hand side of FIG. 11, when FSE=1, FSB=0 and the CLK signal is again overridden and is unable to affect the output of the circuit. For example, when FSB=0, the level at node Y is determined by the value of INV on transistor 1102 since transistor 1103 is held open and the effect of transistor 1101 is cut off from node Y regardless of the value of CLK. Similarly, FSB=0 causes transistor 1104 to be permanently on and the effect of CLK on transistor 1105 is of no consequence. In this case the circuit of FIG. 11 degenerates into a pair of cross coupled NAND gates arranged as a set-reset-latch with inputs INP and INV, and OUT=INP at all times (since INV is always complementary to INP). Again, the circuit becomes functionally equivalent to a buffer. Thus the series combination of MSTR 1000 and SLVE 1100 provides its input, either LIN or RIN depending on the how switch 931 is set, directly to the output of Y-select block 900 for the next Y-select block in FIG. 8 to receive.

Figure 12:
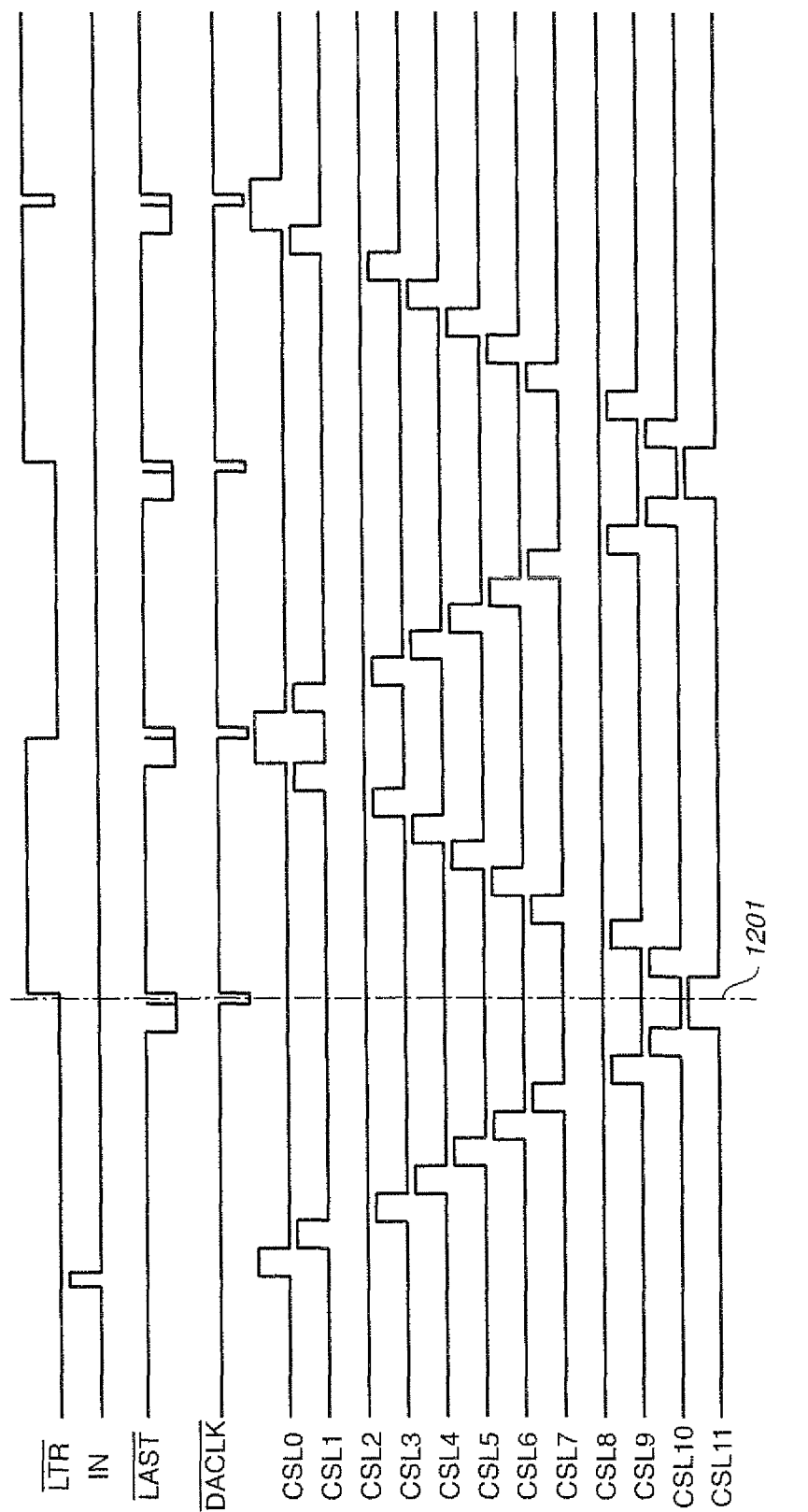
FIG. 12 is a timing diagram showing the operation of the exemplary embodiment of FIGS. 8-11.

FIG. 12 is a timing diagram showing the operation of the exemplary embodiment of FIGS. 8-11. The top line is the signal. $\overline{\text{LTR}}$ (RTL in FIG. 9) and will be low when the pulse is passed to the right in the Y-select circuits 900-$i$ of FIG. 7A, and high when it flows back to the left. The initial pulse or strobe IN that is applied to the input LIN of 900-0 is shown on the second line. The signal $\overline{\text{LAST}}$ indicates when the last Y-select circuit (either the YSELM 900-M on the right or YSEL0 900-0 on the left of FIG. 7A) is reached by going low. $\overline{\text{DACLK}}$ is the signal applied to the Y blocks 800-$i$ of FIG. 7 to load data into the Data Latches or shift the data between them for the next time CSL is asserted. In the case of a non-folded structure, the pulse only shifts through the Y-select circuits once and the signals RTL, $\overline{\text{LAST}}$, and $\overline{\text{DACLK}}$ are not needed; this simplified case is the area to the left of the broken line 1201.

The waveforms below $\overline{\text{DACLK}}$, CSL0-CSL11, show the control signals CSL from the Y-select circuits. In this particular example, there are twelve columns and corresponding Y-select circuits, or M=11 in FIG. 7A, and four Data Latches 802$a$-802$n$ in FIG. 8 controlled by each Y-select circuit. FIG. 12 shows the operation of the circuit after it has been initialized and the bad columns, in this example columns 2 and 8, have been fused out. This initialization consists of reading the list of bad bit lines, for example from the memories ROM at powerup, and supplying this information to the Y-select circuits, such as by the signals I12 and I34 in FIG. 9. The signal PURB is then taken low, followed by SET going high to set the value of FSE of FIG. 9 for each of the Y-select circuits 900-$i$ of FIG. 7A.

At the beginning of FIG. 12, $\overline{\text{LTR}}$ is low so that LIN is active in Y-select 900 and switch 931 of FIG. 9 connects LIN to INP. The pulse IN arrives at LIN of YSEL0 900-0 in FIG. 7A and in the next clock cycle CSL0 is asserted, followed by CSL1 in the cycle after that. As column 2 has been fused out, the pulse passes through YSEL2 900-2 without waiting for the clock, CSL2 stays low, and CSL3 is asserted at the clock immediately following the one at which CSL1 is asserted. CSL4-CSL7 follow in each of the subsequent cycles, the bad column 8 is skipped as with column 2, and CSL9-CSL11 follow in order after CSL7.

In an embodiment with only a single Data Latch for each Y-select circuit, the process would finish at this point, corresponding to the broken line. For embodiments having multiple Data Latches, the process switches to send the pulse back to the left: $\overline{\text{LTR}}$ goes high to activate the RIN inputs of the Y-select circuits and $\overline{\text{DACLK}}$ goes low to reset the Y blocks 800-$i$. The signal $\overline{\text{LAST}}$ is taken low when the pulse reaches the end of the line (YSELM or YSEL0) to hold the pulse in the end registers for an additional clock cycle and assert CSL longer while $\overline{\text{DACLK}}$ and $\overline{\text{LTR}}$ change. (The connection of the signal LAST to the end YSEL blocks is not shown in FIG. 7A.)

The signals then flow back to the other direction, asserting CSL11-CSL0 in order at each cycle and again skipping columns 2 and 8. Once Y-select block 0 is reached, CSL0 is held high for two cycles by $\overline{\text{LAST}}$, during which time $\overline{\text{LTR}}$ is taken back to low and the Data Latches are set up to receive new data. The process then continues as before to load the additional Data Latches and the process is complete.

As the bad columns, columns 2 and 8 in FIG. 12, are removed, as seen from external to the memory circuit 22, the array effectively has 10 good columns, with column 3 perceived as the (now removed) column 2, and so on for the rest of the columns. Consequently, the number of accessible "standard" columns is the actual number of these standard columns less the number of removed bad columns. Thus, again as seen from outside of the memory, the number of accessible standard columns in a block is less than the expected number as the removal of the bad columns is transparent to the controller and the host. As long as the controller/host does not request more than this accessible number of standard columns, this presents no difficulty; however, if the number of requested columns exceeds the number of accessible standard columns, these will be used up before the number of requested columns have been found. Therefore, according to another aspect of the present invention, a set of redundant columns is provided in each sector to replace the removed bad columns.

As with the removal of bad columns, this replacement of bad columns with redundant columns is again a transparent process as seen from external to the memory 22. This transparency makes the present invention particularly useful in embedded environments, where the memory 22 of FIG. 1 is placed directly into the host without use of a controller 20.

Referring back to FIG. 12, the waveforms for a total of 12 column blocks are shown where blocks 2 and 8 are removed. If the memory plane to which these columns belong have 12 or more standard column blocks, then no redundant column blocks are used and after column block 2—and again after column block 8—the physical columns being used on the memory are shifted from the logical columns as addressed on the address lines. If instead, the entire memory plane had only 10 standard column blocks, column blocks 10 and 11 would now be physically present in the redundant column area.

Figure 13A:
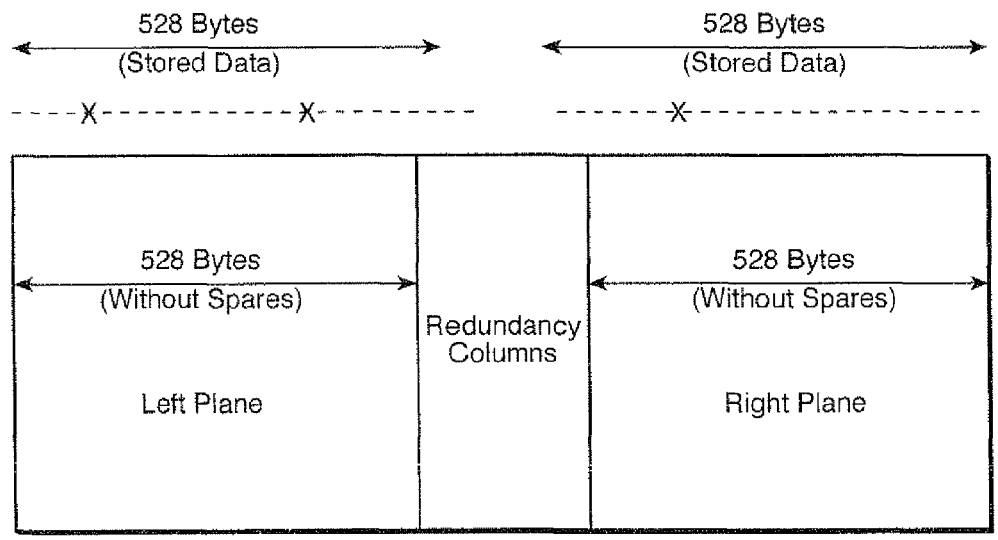
FIGS. 13a and 13b are a schematic representation on the redundant column substitution process.
Figure 13B:
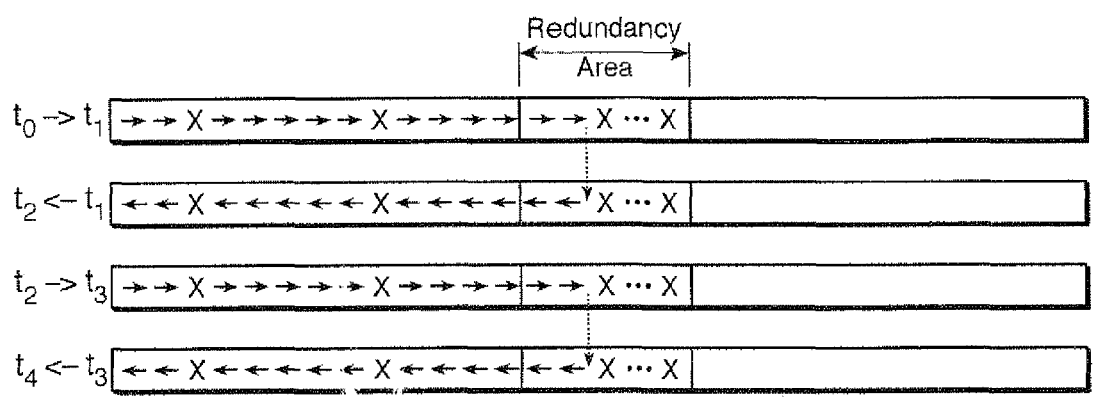

FIGS. 13$a$ and 13$b$ are a schematic representation of the redundant column substitution process in an exemplary embodiment. FIG. 13$a$ shows one possible architecture of a memory array, consisting of a left and right plane, each of which holds 528 Bytes of data on each word line. FIG. 13$b$ shows how the column block substitution process proceeds as data is written into the array. The basic assumption is that in order to program all cells on one word line, data will be written into four separate Data Latches (802a-802d in FIG. 8) in each column block. For example, if the external controller transmits one page of 528 bytes (512 bytes of User Data and 16 bytes of Overhead Data such as ECC or other information to be written into the memory) by transmitting one byte at a time before issuing the write command, one byte of data will be transmitted during each clock cycle, and to load the entire page the shift register will scan through the available column blocks in a plane four times. This means that each plane consists of 132 (=528 Bytes/4 pages) column blocks and each block contains 32 (4 Passes*8 bits/byte) bit lines. In FIG. 13b, all of the normal columns of the left half-array are to be accessed and two of these columns blocks are bad. As the pulse IN will travel through the full number of columns, the two bad column blocks are replaced by two redundant column blocks. In FIG. 13b, the non-used blocks are indicated by an x. The pulse begins at the left side and is propagated until it reaches the first bad column block, which is then skipped. The pulse then continues through the rest of the normal section, again skipping the second bad column block. As there are still two column blocks missing, the pulse continues on and picks up two extra column blocks in the redundancy area. As only two redundant blocks are needed, the remaining portion of the redundancy area is ignored and not accessed, as shown by the x's, and the process continues with a second pass toward the left. The last pulse of one pass and first pulse of the next pass are the same CSL signal and are held by the LAST signal for an extra clock signal while the DACLK signal is asserted and the RTL value changed. The bad column blocks are again skipped and the process similarly continues through the third and fourth tiers. Note that each column block holds data from widely separated logical bytes of the input data stream. For example, the first column block holds data from bytes 1, 264, 265, and 528.

The boundary in the redundancy area at which the pulse turns around is not a fixed boundary, but determined by the number of blocks needing to be replaced. This is illustrated schematically in FIG. 13b where the left and right sides of the array structure share the redundancy columns to make the replacement process more flexible. This is again shown for an exemplary embodiment having a folded structure and using bi-directional shift registers. In this example, each sub-array is structured to hold 528 bytes of data along each word line. In the middle are placed the redundancy blocks. Both the right and left sides will access the number of redundant columns needed to replace their corresponding number of bad columns. As shown in FIG. 13a, the left array has two bad column blocks (as again shown by the x's) and will consequently appropriate two of the redundant column blocks with the pulse extending in to access these extra blocks before propagating back to the left. Similarly, on the right side shown with one bad block, the pulse begins on the right and will travel in to access one replacement block from the redundant area before travelling back to the right.

Techniques Allowing Random Access to Shift Register with Skipped Entries

The preceding section, which is developed more in U.S. Pat. No. 7,170,802, describes an arrangement where, when accessing the memory array, defective columns are skipped in a way that can be transparent to the controller. Based on a bit associated with a column, the associated shift register associated that column is skipped and the clock signal passes to the next column. When a specific piece of data content needs to accessed, the controller will convert a received logical address into a corresponding physical address, which is then passed on to the controller. The physical address then needs to be translated into a corresponding column. For this to be accurately done, the memory needs to account any defective columns. One way to do this would be to start at the first column and let the system shift by the number of corresponding clocks, as the defective columns would be skipped; however, this would be require the corresponding of clock cycles to elapse. To go more directly to the correct column requires a way to offset the column address to account for those columns whose skip bit is set. This section considers a technique to deal with this problem. More detail related to a column based access method can be found in US patent publication number 2011/0002169 A1, which presents techniques for dealing with defective individual bits within a column, and in U.S. Pat. No. 7,974,124, that presents various additional arrangements for accessing columns when these are arranged into multiple tiers.

Although the preceding section is based on a particularly embodiment, this situation can arise more generally. A more general context can be described with respect to FIGS. 14 and 15. Here, the columns are split into groups and one of each the shift registers for column selection is attached to one column from each group. To access all of the columns, the shift registers will need to loop through the shifter registers enough times pick up all of the columns. For example, the columns can be split into groups, or tiers, of every 16th column. On the first trip of the pointer through the registers, the first tier would be accessed, followed by the second tier on the second loop and so on.

Figure 14:
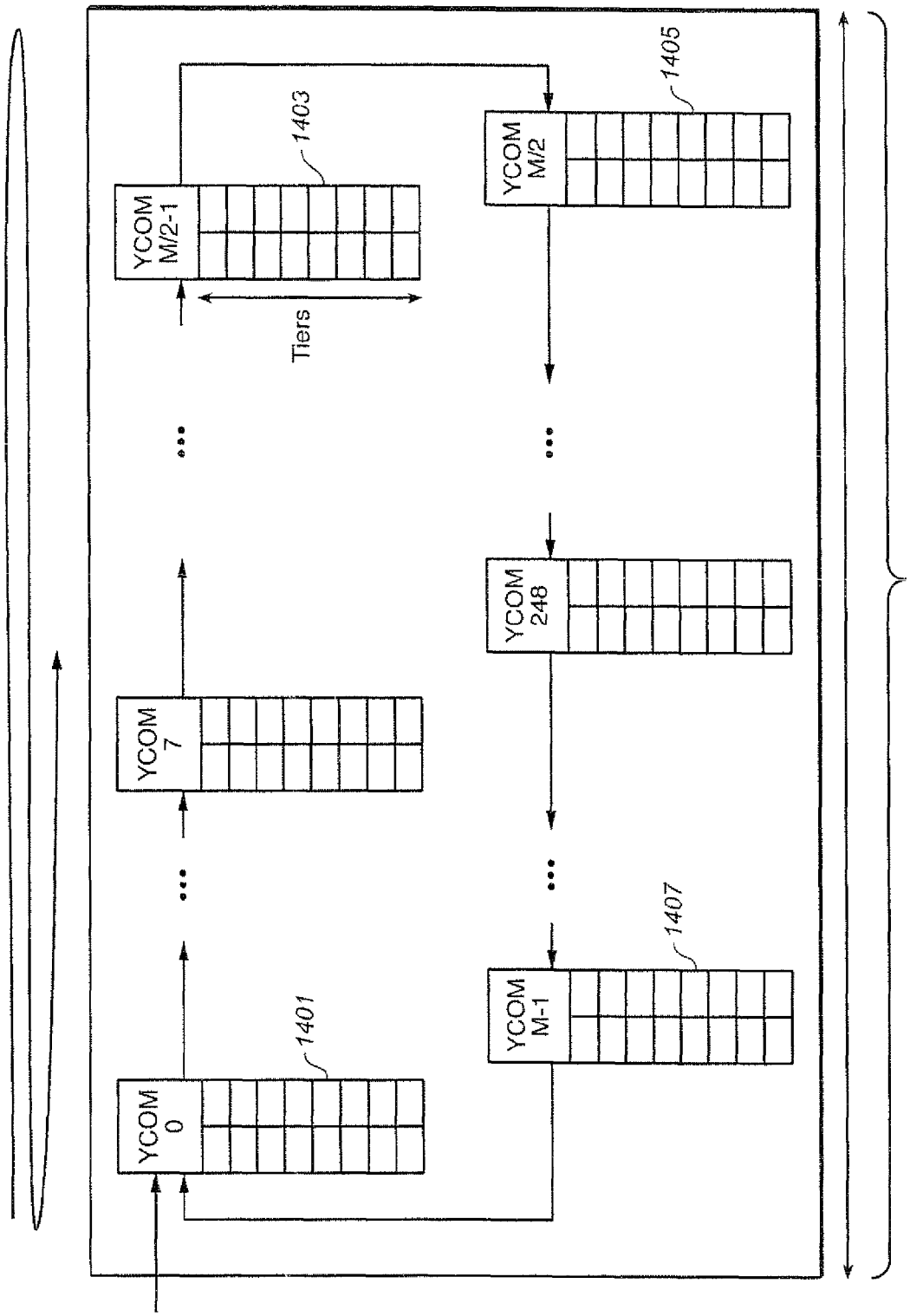
FIG. 14 illustrates how the pointer travels through the read/write stacks.
Figure 15:
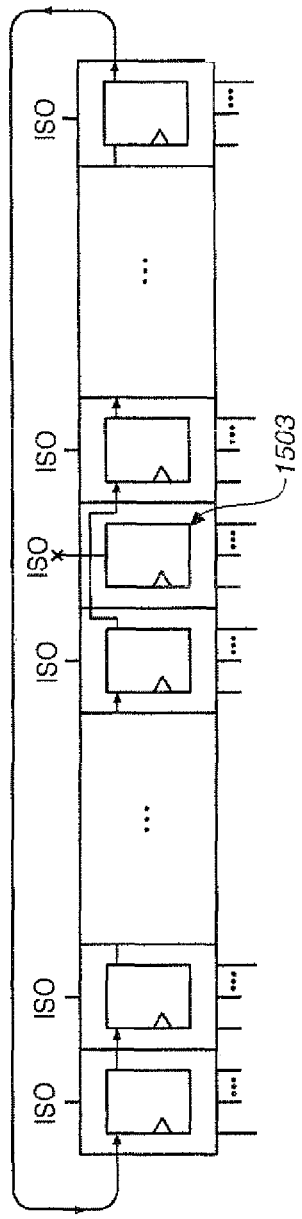
FIG. 15 schematically represents the process whereby the defective columns are skipped.

FIG. 14 illustrates how the pointer travels through the read/write stacks. Each of the groups YCOM 0 to YCOM (M−1) (1401, . . . , 1403, 1405, 1407) would correspond to the access circuitry between array and shift registers such as shown FIGS. 7 and 8, but with the detailed elements suppressed for the purposes of this discussion. The boxes of each of the 1401-1407 represent the various tiers they can hold. The group stacks, or column access circuits, YCOM-0 to YCOM-(M−1) (1401, . . . , 1403, 1405, . . . , 1407) are shown staggered into two rows for illustrative purposes, but this need not reflect their physical layout on the device. The first group of bit lines (starting at left) would be connected to 1401 for group 0, the second group of bit lines would be connected to 1407 for group (M−1), and so on Depending on the embodiment, the pointer can run through all of the groups from one side to other, then loop back, or pick up every other one in one direction, with the other half picked up on the return trip, or various other arrangements. (For more discussion, see, for example, US patents or publications numbers U.S. Pat. Nos. 6,983,428; 7,170,802; 7,974,124; or 2011/0002169 A1.

In a typical device, M may run into the hundreds. The pointer traverses the groups from group 0 1401 to group (M−1) 1407, after which it completes one loop which covers all the columns in one tier. In the example 16 loops are required in order to access all the columns in a page. The pointer will traverses its way through the tiers until they are all read out (or all the desired data accessed), before moving on to the next word line. This is illustrated schematically by the arrow at the top of FIG. 14, where the trip from right to left reads out a first tier, after which it continues again to the next tier.

As discussed in the preceding section, in the process the defective columns are skipped when their corresponding column is fused out. This is represented schematically with respect to FIG. 15. The series of boxes represent the column select circuitry containing shift registers through the clock signal propagates, looping around to put up the columns (represented at bottom) for all of the tiers. Each box also has as input the isolation bits (ISO) indicating which associated columns are bad and to be skipped. For example, at 1503 for a bad column the shift register is skipped by the clock signal bypassing the associated shifter register.

Figure 16:
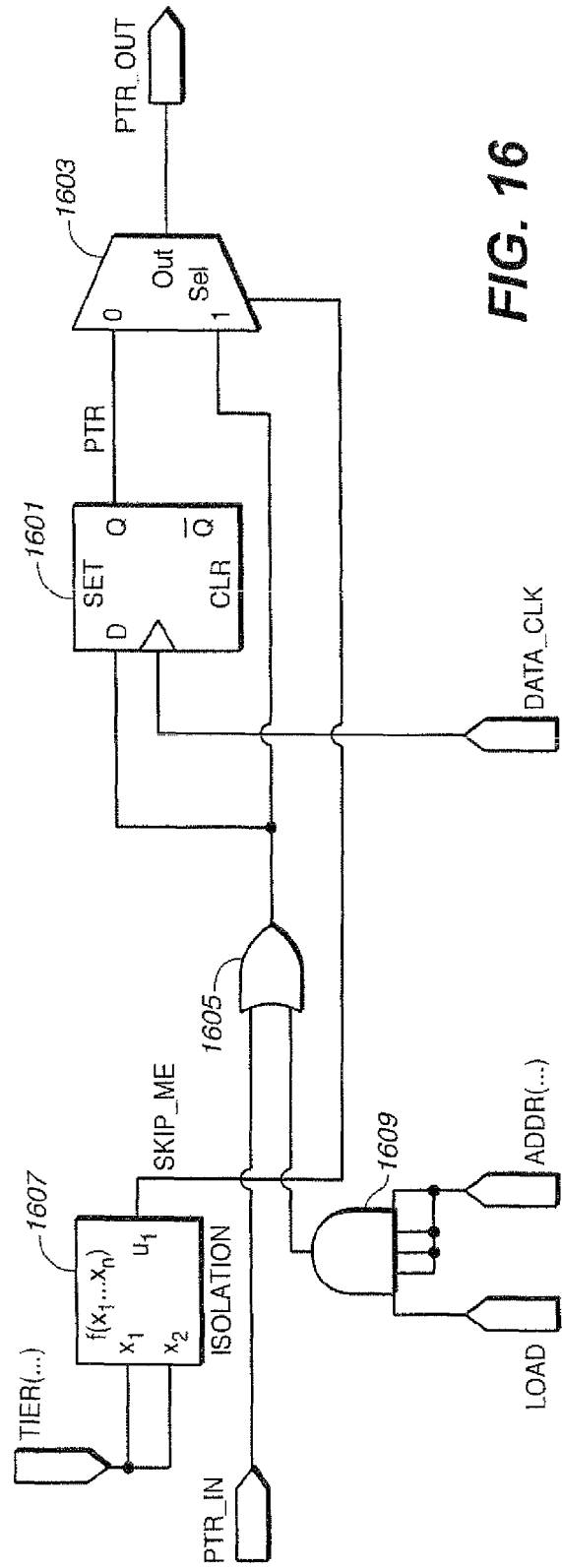
FIG. 16 shows circuitry for a shift register structure with skip information.

To access a memory cell along a given column, while still accounting for any defective columns, the pointer could be shifter through the columns for the corresponding number of clock cycles; however, as noted above, given that the number of columns can be quite large, this could require a corresponding large number of clock cycles. Alternately, the initial physical location could be located by inputting the address, but any translation in a looping shift register with random skips on each loop will need to account for the skipped columns. FIG. 16 shows an example of a register that accounts for the skip information.

In the example, the sequence of shift registers has a length L and loops P times, corresponding to P tiers. The incoming pointer PRT_IN of the shifter register comes in at the left, where it is then put into the flip-flop 1601 that also receives the clock signal DATA_CLK and provides the output PTR that then becomes the output pointer PTR_OUT, which is in turn the input for the next stage for the shift register. The multiplexer 1603 allows the flip-flop to be skipped in case of a defective column by allowing PTR_IN to transfer straight to PTR_OUT without waiting to be clocked. On each entry of the looping shift registers, there is 1 bit information of each loop to indicate if need to skip current entry. The multiplexer is controlled by the SKIP_ME signal from the isolation latch 1607, where it is determined by the defect bits TIER[ . . . ] for each of the tiers corresponding to the stage of the shift register. In addition to having the PTR_IN input, the OR gate 1605 also for the direct input of an address. The address ADDR[ . . . ], along with an enable signal LOAD, are input at the gate 1609.

When the memory receives an address, this needs to be converted into the corresponding loop and the residual address designating the shift register in the corresponding loop. To account for any bad columns, this address will need to be offset accordingly. Consequently, a record of these bad columns will need to be maintained for this purpose. For this, the memory circuit will need to set aside enough array space to store all the skipped addresses of size N(max number of skipped entry)*(n1+n2), here $2^{n1} \geq P$ (total loops) and $2^{n2} \geq L$ (shift register length). The skipped addresses can then be stored in the ascending order, so that the content of entry j+1 would always greater than entry j. Each entry of the array will have a comparator to indicate if the input is greater than itself. In addition to the N by (n1+n2) array and comparator, there is an output select circuit will output the highest entry number which is greater than the input.

Under this arrangement, when an address A_in is received, it will be divided by L and output the quotient is equal to A_LOOP_in and output modular is A_SR_in. A_LOOP_in is the loop location, and the residual portion A_SR_in is the input shift register location. {A_LOOP_in, A_SR_in} differs from the real loop and shift register location by how many skipped entry before this address. When {A_LOOP_in, A_SR_in} is input into the array of the comparator, it will have output D from the output selector. If (A_SR_in+D)<L, the final shift register location is (A_SR_in+D) within the loop location A_LOOP_in; otherwise, it the shift register location is (A_SR_in+D)−L and loop location is the nest loop, (A_LOOP_in+1).

Although the arrangement just described with respect to FIG. 16 allows for the automatic location of a physical location in a looping shift register with random skips on each loop, it has the drawback of requiring a relatively large amount of memory needing to be set aside for maintaining this information, as it must be able to specify an address for the maximum number of allowed bad columns, as well as the comparator circuitry. Relative to the arrangement described with respect to FIG. 16, the exemplary embodiment presented below will reduce the amount of hardware needed to translate a logical continuous address into the physical address of the corresponding loop and location in the shift register.

More specifically, the memory uses a look-up table for the initial skip of each loop instead of using the comparators on the input logical address, thereby saving on circuitry requirements. So, instead of specifying the address for each defective column in a loop, the memory just the needs a few bits to specify the number of bad columns (e.g., 5) in a loop. For example, in the case of 16 tiers, say, four bits could be set aside for each, so that only 4×16 bits are needed—or, 4×15 bits since the exemplary embodiment does not use this information is not used for the last loop in the series.

The look-up table size depends on the maximum skipped column N and total loop number P. In the exemplary embodiment, two entries are used on every loop is needed, one for A_SR_in<L/2 and the other for A_SR_in>L/2. If the skipped columns are distributed fairly evenly across every loop, the look up table result would need a minimum number of bits to represent. The output size of the look up table S then be $2^{\wedge}(\log_2 N+1) > 2^S \geq N/P$. If we call the output from the table D, then the memory will find the value D from the look up table. If (A_SR_in+D)<L, final shift register location in the corresponding loop is the residual portion A_SR_in offset by the value D, (A_SR_in+D), in loop A_LOOP_in. If (A_SR_in+D)>L, the offset will push it over into the next loop at loop location (A_LOOP_in+1), where the shift register location is then ((A_SR_in+D)−L).

Figure 17:
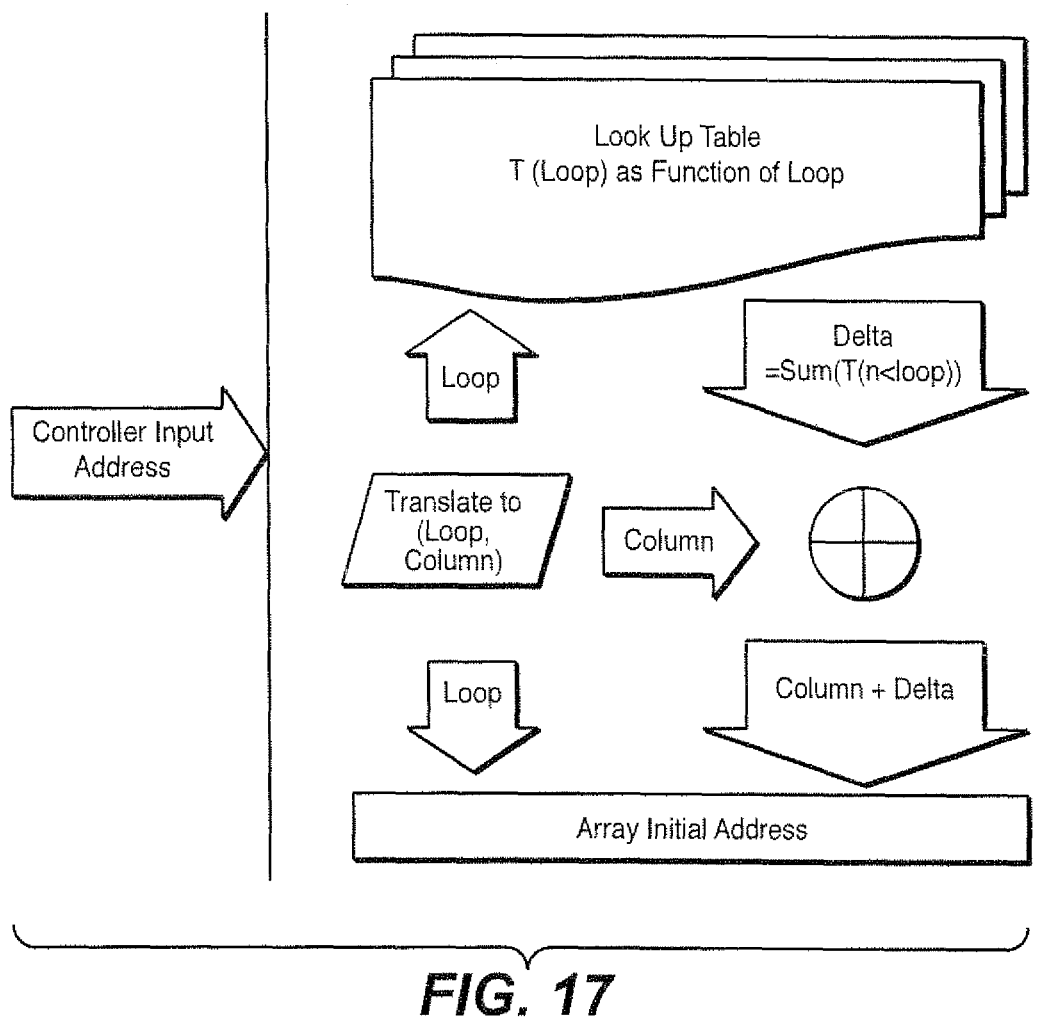
FIG. 17 schematically illustrates how an address is translated into a loop, column format and then offset for defective columns in preceding loops.

This translation and offset process is illustrated with respect to FIG. 17. From the left, the memory receives an address from the controller. (In other cases, in embodiments without a controller, the address could be directly from the host.) The controller will have performed the logical to physical address translation, but will not be in terms of loop number and residual column address within the loop. This input address is then converted into (loop, column) format, but as the defective column skip process is transparent to the controller, this initial (loop, column) will take into account defective columns. To determine the offset, the loop value is sent to the loop up table, which can then provide the offset value of delta this is the sum of the number of defective column in all the loops preceding loop corresponding to the (uncorrected) input address. (If defective column counts are kept for half-loops (or other sub-division of the loop), then this would the sum of preceding half-loops or other sub-division.) The offset delta is then added to the column address to find the initial input address for the shift registers. Not that if column+delta value exceeds the length of the loop, this will need to be accounted for by having the address wrap around onto the next loop. Under this arrangement, note that although array initial address has been offset for defective columns in any preceding loops, it will not have taken into account any defective column preceding the offset column address in the loop itself.

Figure 18:
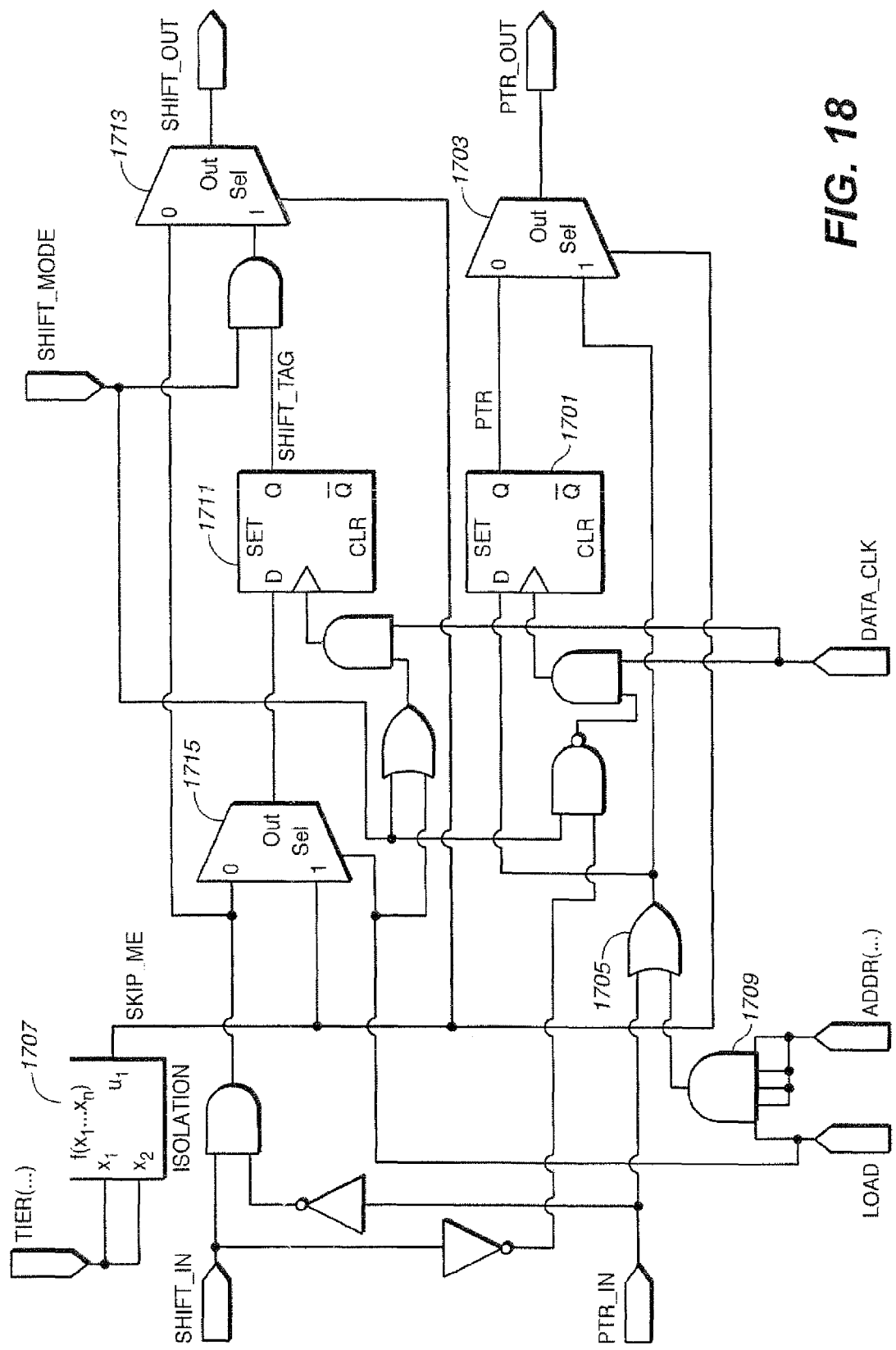
FIG. 18 shows circuitry for an exemplary embodiment of a shift register structure with skip information and shift mode.

This physical address will, however, be close to where the actual address is. To pick up this additional offset, the shift register structure is altered. The modified structure of the shift register will enable an automatic shift mode: After the approximate address is set, the memory will assert a SHIFT_MODE signal high and send some number of clocks to shift the pointer to correct location. FIG. 18 illustrates an exemplary embodiment.

In FIG. 18, the elements of 1701, 1703, 1705, 1707, and 1709 respectively correspond to element 1601, 1603, 1605, 1607, and 1609 of FIG. 16 and function similarly, except that the input at address ADDR[ . . . ] at 1709 will now include the offset delta. The other elements of the structure are used to effect the shift for any defective columns preceding the desired column within the loop itself.

The exemplary embodiment's structure has one more register with flip-flop 1711 whose output is SHIFT_TAG and some logic gates along with the original shift register. The extra shift register will count how many skipped entry before the current pointer and shift the current pointer accordingly based on the additional clock(s) supplied. The extra series of shift registers has SHIFT_IN and SHIFT_OUT as the respective input and outputs, where the multiplexer 1713 that determines whether the output is SHIFT_TAGE or the flip-flop 1711 is skipped is again controller by the SKIP_ME value for the column. The additional multiplexer 1715 is controlled by the enable signal LOAD. The extra input SHIFT_MODE is then asserted the mode of operation is to be used. Although a specific arrangement for the various logic gates is shown, other implementations of logic elements can be used in variations of the shown embodiment.

This arrangement allows for implementation of a random access shift register where there may be a number of skipped shift register entries that saves on the circuitry of the comparators and uses some small and simple circuitry along with the shift register. If the shift register area is limited by metal routing, and not by the active circuitry, this can save overall circuit area. As described, the look-up table is used to get the offset value to initialize the address to the close location of the final address, with SHIFT_TAG get the initial value from isolation latch. As the lookup table is on the chip the process can be transparent to the controller or host.

Although the various aspects of the present invention have been described with respect to specific embodiments, it will be understood that the invention is protected within the full scope of the appended claims.

It is claimed:

1. A method of accessing a non-volatile memory circuit, the memory circuit including an array non-volatile memory cells formed along multiple columns, the array having a series of first shift registers connected thereto, each first shift register connected to a distinct plurality of N of the columns, where as a pointer moves through the series of first shift registers in response a clock signal one of the columns connected thereto is selected and the pointer loops through the series of first shift registers N times to access all of the columns, wherein each column has an associated bit indicating whether it is defective, in response to which the first shift register skips the corresponding defective column in the series, the method comprising:

maintaining in the non-volatile memory a count of the number of defective columns for each loop except the last in the series;

receiving an address;

determining the corresponding loop and residual column address within the corresponding loop for the received address if none of the columns were defective;

determining from the count of defective columns for each loop the cumulative number of defective columns for the loops preceding the loop to which the received address would correspond if none of the columns were defective;

offsetting the residual column address within the corresponding loop to which the received address would correspond by the cumulative number of defective columns for the preceding loops; and starting from the offset column address in the corresponding loop, subsequently shifting through the columns to account for defective columns in the corresponding loop.

2. The method of claim 1, the memory further having a second series of shift registers connected thereto, each of the shift registers from the second series being associated with a corresponding shift register from the first series, whereby the memory circuit performs said shifting through the columns to account for defective columns in the corresponding loop.

3. The method of claim 1, wherein the memory circuit is part of a memory system further includes a controller circuit, wherein the address is received from the controller and the offsetting of the column is performed on the memory circuit transparently to the controller circuit.

4. The method of claim 1, wherein the count of the number of defective columns for each loop except the last in the series is maintained as a look up table in the non-volatile memory.

5. The method of claim 1, wherein the count of the number of defective columns for each loop except the last in the series is initially determined in a test process.

6. The method of claim 5, further comprising:

updating the initially determined count of the number of defective columns for each loop except the last in the series to include columns subsequently determined to be defective.

7. The method of claim 1, wherein the memory array is formed according to a NAND architecture.

8. The method of claim 1, further comprising:

determining whether said offsetting the residual column address shifts the column address onto the next loop in the sequence; and in response to the determining the offsetting shifts the address to the next loop, changing the corresponding loop to the next loop and correcting the offset column address accordingly prior to subsequently shifting through the columns.

9. The method of claim 1, wherein:

maintaining in the non-volatile memory a count of the number of defective columns for each loop except the last in the series includes maintaining a count of the number of defective columns for each half-loop except the last half of the last loop in the series;

determining the cumulative number of defective columns includes determining the number of defective columns for the half-loops preceding the half-loop to which the received address would correspond if none of the columns were defective; and offsetting the residual column address is by the cumulative number of defective columns for the preceding half-loops.

10. A non-volatile memory circuit, including an array of non-volatile memory cells formed along multiple columns;

a series of first shift registers each connected to a distinct plurality of N of the columns connected to receive a clock signal, where as a pointer moves through the series of first shift registers in response the clock signal one of the columns connected thereto is selected and the pointer loops through the series of first shift registers N times to access all of the columns, wherein each column has an associated bit indicating whether it is defective, in response to which the first shift register skips the corresponding defective column in the series, and wherein the memory circuit maintains in the non-volatile memory a count of the number of defective columns for each loop except the last in the series;

decoding circuitry that, in response to a received address, determines the corresponding loop and residual column address within the corresponding loop for the received address if none of the columns were defective, determines from the count of defective columns for each loop the cumulative number of defective columns for the loops preceding the loop to which the received address would correspond if none of the columns were defective, and offsets the residual column address within the corresponding loop to which the received address would correspond by the cumulative number of defective columns for the preceding loops; and a second series of shift registers, each of the second series of shift registers associated with a corresponding shift register from the first series, whereby the offset column address is subsequently shifted through the columns to account for defective columns in the corresponding loop.

11. The non-volatile memory circuit of claim 10, wherein the memory circuit is part of a memory system including a controller circuit, wherein the address is received on the memory circuit from the controller and the offsetting of the column is performed on the memory circuit transparently to the controller circuit.

12. The non-volatile memory circuit of claim 10, wherein the count of the number of defective columns for each loop except the last in the series is maintained as a look up table in the non-volatile memory.

13. The non-volatile memory circuit of claim 10, wherein the count of the number of defective columns for each loop except the last in the series is initially determined in a test process.

14. The non-volatile memory circuit of claim 13, wherein the initially determined count of the number of defective columns for each loop except the last in the series is updated to include columns subsequently determined to be defective.

15. The non-volatile memory circuit of claim 10, wherein the memory array is formed according to a NAND architecture.

* * * * *